United States Patent
Liu et al.

(10) Patent No.: US 11,462,591 B2
(45) Date of Patent: Oct. 4, 2022

(54) DISPLAY DEVICE COMPRISING A SPECIFIED ARRANGEMENT OF SUB-PIXELS AND SPACERS

(71) Applicant: BOE TECHNOLOGY GROUP CO., LTD., Beijing (CN)

(72) Inventors: Libin Liu, Beijing (CN); Qian Yang, Beijing (CN); Hongli Wang, Beijing (CN); Lujiang Huangfu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 40 days.

(21) Appl. No.: 16/622,045

(22) PCT Filed: Dec. 28, 2018

(86) PCT No.: PCT/CN2018/124881
§ 371 (c)(1),
(2) Date: Dec. 12, 2019

(87) PCT Pub. No.: WO2019/153948
PCT Pub. Date: Aug. 15, 2019

(65) Prior Publication Data
US 2020/0212125 A1 Jul. 2, 2020

(30) Foreign Application Priority Data
Feb. 9, 2018 (CN) .............................. 201810135948

(51) Int. Cl.
*H01L 27/32* (2006.01)
*H01L 51/52* (2006.01)

(52) U.S. Cl.
CPC ........ *H01L 27/3218* (2013.01); *H01L 27/326* (2013.01); *H01L 27/3213* (2013.01);
(Continued)

(58) Field of Classification Search
CPC ............. H01L 27/3213; H01L 27/3216; H01L 27/3218; H01L 27/326; H01L 27/3272; H01L 51/5275
See application file for complete search history.

(56) References Cited

U.S. PATENT DOCUMENTS

| 4,491,863 A | 1/1985 | Kurahashi |
| 4,652,912 A | 3/1987 | Masubuchi |

(Continued)

FOREIGN PATENT DOCUMENTS

| CN | 101192382 A | 6/2008 |
| CN | 101339729 B | 6/2010 |

(Continued)

OTHER PUBLICATIONS

Notice of Allowance in U.S. Appl. No. 16/630,496 dated Mar. 26, 2021.

(Continued)

*Primary Examiner* — Herve-Louis Y Assouman
*Assistant Examiner* — Christopher M Roland
(74) *Attorney, Agent, or Firm* — Collard & Roe, P.C.

(57) ABSTRACT

A display substrate and a display device. The display substrate comprises a first sub-pixel (111), a second sub-pixel (112), and a first spacer (0101). A line connecting the center (C1) of the first sub-pixel (111) and the center (C2) of the second sub-pixel (112) is a center line (CL1); the center line (CL1) is not perpendicular to a first direction (X); the first direction (X) is at least one of the row direction or the column direction. The first spacer (0101) is disposed between the first sub-pixel (111) and the second sub-pixel (112), and the extension direction (E01) of first spacer (0101) between the first sub-pixel (111) and the second sub-pixel (112) is not perpendicular to the first direction (X). Therefore, the display substrate can improve the different viewing angle color cast and improve the display quality.

18 Claims, 15 Drawing Sheets

(52) U.S. Cl.
CPC ...... *H01L 27/3216* (2013.01); *H01L 27/3272* (2013.01); *H01L 51/5275* (2013.01)

(56) References Cited

U.S. PATENT DOCUMENTS

| | | | |
|---|---|---|---|
| 5,113,274 A | 5/1992 | Takahashi et al. | |
| 5,341,153 A | 8/1994 | Benzschawel et al. | |
| 6,768,482 B2 | 7/2004 | Asano et al. | |
| 6,950,115 B2 | 9/2005 | Brown Elliott | |
| 7,123,277 B2 | 10/2006 | Brown Elliott et al. | |
| 7,525,526 B2 | 4/2009 | Brown Elliott et al. | |
| 7,663,299 B2 | 2/2010 | Chao et al. | |
| 7,733,359 B1 | 6/2010 | Hagge et al. | |
| 8,159,508 B2 | 4/2012 | Lee | |
| 8,330,352 B2 | 12/2012 | Sung et al. | |
| 8,363,072 B2 | 1/2013 | Hong et al. | |
| 8,446,435 B2 | 5/2013 | Tomizawa et al. | |
| 8,754,913 B2 | 6/2014 | Hwang et al. | |
| 8,994,015 B2 | 3/2015 | Pyon et al. | |
| 9,337,241 B2 | 5/2016 | Lee et al. | |
| 9,343,511 B1 | 5/2016 | Feng | |
| 9,424,771 B2 | 8/2016 | Gong | |
| 9,472,600 B2 | 10/2016 | Lin et al. | |
| 9,570,706 B2 | 2/2017 | Yim et al. | |
| 9,647,039 B1 | 5/2017 | Wang et al. | |
| 9,704,926 B2 | 7/2017 | Kim | |
| 9,734,753 B2 | 8/2017 | Li et al. | |
| 9,818,803 B2 | 11/2017 | Lee | |
| 9,871,085 B2 | 1/2018 | Cho et al. | |
| 9,905,604 B2 | 2/2018 | Murata | |
| 9,946,123 B2 | 4/2018 | Huangfu et al. | |
| 9,984,624 B2 | 5/2018 | Takahashi et al. | |
| 10,026,785 B2 | 7/2018 | Bai et al. | |
| 10,068,541 B2 | 9/2018 | Sakaigawa | |
| 10,181,499 B2 | 1/2019 | Jo et al. | |
| 10,210,787 B2 | 2/2019 | Jin | |
| 10,274,654 B2 | 4/2019 | Jin et al. | |
| 10,283,086 B1 | 5/2019 | Su et al. | |
| 10,373,541 B2 | 8/2019 | Lee et al. | |
| 10,504,483 B2 | 12/2019 | Chen et al. | |
| 10,520,775 B2 | 12/2019 | You et al. | |
| 10,565,918 B2 | 2/2020 | Wu et al. | |
| 10,579,173 B2 | 3/2020 | Xu et al. | |
| 10,629,656 B2 | 4/2020 | Jo et al. | |
| 10,699,642 B2 | 6/2020 | Ma et al. | |
| 10,854,684 B2 | 12/2020 | Huangfu et al. | |
| 10,861,905 B2 | 12/2020 | Wang | |
| 10,867,545 B2 | 12/2020 | Kirisken | |
| 10,909,901 B2 | 2/2021 | Wu et al. | |
| 10,943,955 B2 | 3/2021 | Wang et al. | |
| 10,991,768 B2 | 4/2021 | Li et al. | |
| 11,069,286 B2 | 7/2021 | Tan et al. | |
| 11,233,096 B2 | 1/2022 | Huangfu et al. | |
| 11,238,816 B2 | 2/2022 | Huangfu et al. | |
| 11,264,430 B2 | 3/2022 | Huangfu et al. | |
| 2005/0018110 A1 | 1/2005 | Liu | |
| 2007/0205423 A1 | 9/2007 | Yamazaki et al. | |
| 2007/0290973 A1 | 12/2007 | Wei | |
| 2008/0001525 A1 | 1/2008 | Chao et al. | |
| 2009/0121983 A1 | 5/2009 | Sung et al. | |
| 2009/0302331 A1 | 12/2009 | Smith et al. | |
| 2010/0289732 A1 | 11/2010 | Ina et al. | |
| 2011/0025723 A1 | 2/2011 | Kim | |
| 2011/0127506 A1 | 6/2011 | So | |
| 2011/0128262 A1 | 6/2011 | Chaji et al. | |
| 2011/0234550 A1 | 9/2011 | Hong et al. | |
| 2011/0260951 A1 | 10/2011 | Hwang et al. | |
| 2011/0291549 A1 | 12/2011 | Kim et al. | |
| 2011/0291550 A1 | 12/2011 | Kim et al. | |
| 2012/0039034 A1 | 2/2012 | Jepsen et al. | |
| 2012/0092238 A1 | 4/2012 | Hwang et al. | |
| 2012/0313844 A1 | 12/2012 | Im et al. | |
| 2013/0234917 A1 | 9/2013 | Lee | |
| 2014/0003045 A1 | 1/2014 | Lee et al. | |
| 2014/0198479 A1 | 7/2014 | Chao et al. | |
| 2014/0226323 A1 | 8/2014 | Huang et al. | |
| 2014/0252321 A1 | 9/2014 | Pyon et al. | |
| 2014/0284570 A1* | 9/2014 | Jinta | H01L 27/3213 257/40 |
| 2014/0292622 A1 | 10/2014 | Lee | |
| 2014/0346537 A1 | 11/2014 | Xi | |
| 2015/0008820 A1* | 1/2015 | Lee | H01L 27/3246 313/504 |
| 2015/0015465 A1 | 1/2015 | Gong | |
| 2015/0021637 A1 | 1/2015 | Ahn et al. | |
| 2015/0102320 A1 | 4/2015 | Jung | |
| 2015/0162391 A1* | 6/2015 | Kim | H01L 51/525 257/40 |
| 2015/0162394 A1 | 6/2015 | Tokuda et al. | |
| 2015/0270317 A1 | 9/2015 | Lee et al. | |
| 2015/0311264 A1* | 10/2015 | Shen | H01L 27/3218 257/40 |
| 2016/0049438 A1 | 2/2016 | Murata | |
| 2016/0078807 A1 | 3/2016 | Sun et al. | |
| 2016/0126295 A1 | 5/2016 | Sato | |
| 2016/0126296 A1 | 5/2016 | Feng | |
| 2016/0126298 A1 | 5/2016 | Chen | |
| 2016/0155781 A1 | 6/2016 | Chaji | |
| 2016/0171918 A1 | 6/2016 | Kim et al. | |
| 2016/0190523 A1 | 6/2016 | Kim et al. | |
| 2016/0196776 A1 | 7/2016 | Yang et al. | |
| 2016/0240593 A1 | 8/2016 | Gu et al. | |
| 2016/0253943 A1 | 9/2016 | Wang | |
| 2016/0254476 A1 | 9/2016 | Park | |
| 2016/0293678 A1 | 10/2016 | Wang | |
| 2016/0343284 A1 | 11/2016 | Sun | |
| 2016/0351119 A1 | 12/2016 | Ono | |
| 2016/0357076 A1 | 12/2016 | Huangfu et al. | |
| 2016/0358536 A1 | 12/2016 | Li et al. | |
| 2016/0358985 A1 | 12/2016 | Bai et al. | |
| 2016/0370919 A1 | 12/2016 | Xu et al. | |
| 2017/0039924 A1 | 2/2017 | Jin | |
| 2017/0133440 A1 | 5/2017 | Wang et al. | |
| 2017/0193880 A1 | 7/2017 | Lee et al. | |
| 2017/0294491 A1 | 10/2017 | Jo et al. | |
| 2017/0317150 A1 | 11/2017 | Chung et al. | |
| 2017/0352710 A1 | 12/2017 | Hong et al. | |
| 2018/0012547 A1 | 1/2018 | Li et al. | |
| 2018/0088260 A1 | 3/2018 | Jin et al. | |
| 2018/0097043 A1 | 4/2018 | Song | |
| 2018/0247984 A1 | 8/2018 | Wang et al. | |
| 2018/0308412 A1 | 10/2018 | Wu et al. | |
| 2018/0308907 A1 | 10/2018 | Jin et al. | |
| 2018/0355466 A1 | 12/2018 | Mu | |
| 2019/0035859 A1 | 1/2019 | Kang et al. | |
| 2019/0066564 A1 | 2/2019 | Tan | |
| 2019/0096962 A1 | 3/2019 | Han et al. | |
| 2019/0139513 A1 | 5/2019 | Su et al. | |
| 2019/0140030 A1 | 5/2019 | Huangfu et al. | |
| 2019/0206341 A1 | 7/2019 | Liao et al. | |
| 2019/0237518 A1 | 8/2019 | Sun et al. | |
| 2019/0326365 A1 | 10/2019 | Jin | |
| 2019/0333970 A1 | 10/2019 | Lee | |
| 2019/0340970 A1 | 11/2019 | Kirisken | |
| 2020/0013833 A1 | 1/2020 | Wang et al. | |
| 2020/0035172 A1 | 1/2020 | Chen | |
| 2020/0043990 A1 | 2/2020 | Huangfu et al. | |
| 2020/0119107 A1 | 4/2020 | Liu et al. | |
| 2020/0258441 A1* | 8/2020 | Zhang | G09G 3/2003 |
| 2020/0328259 A1 | 10/2020 | Joe | |
| 2020/0357862 A1 | 11/2020 | Wang et al. | |
| 2021/0091145 A1 | 3/2021 | Huangfu et al. | |
| 2021/0335297 A1* | 10/2021 | Huangfu | G09G 3/2003 |
| 2022/0028348 A1 | 1/2022 | Huangfu et al. | |

FOREIGN PATENT DOCUMENTS

| | | |
|---|---|---|
| CN | 102201430 A | 9/2011 |
| CN | 101582241 B | 10/2011 |
| CN | 103681754 A | 3/2014 |
| CN | 104037202 A | 9/2014 |
| CN | 104051493 A | 9/2014 |
| CN | 104269411 A | 1/2015 |

(56) References Cited

FOREIGN PATENT DOCUMENTS

| | | |
|---|---|---|
| CN | 104282727 A | 1/2015 |
| CN | 104332486 A | 2/2015 |
| CN | 104362170 A | 2/2015 |
| CN | 104597655 A | 5/2015 |
| CN | 104637987 A | 5/2015 |
| CN | 104701341 A | 6/2015 |
| CN | 104795431 A | 7/2015 |
| CN | 104882464 A | 9/2015 |
| CN | 105280139 A | 1/2016 |
| CN | 205231065 U | 5/2016 |
| CN | 205355055 U | 6/2016 |
| CN | 105938266 A | 9/2016 |
| CN | 205608350 U | 9/2016 |
| CN | 205845956 U | 12/2016 |
| CN | 106293244 A | 1/2017 |
| CN | 106601167 A | 4/2017 |
| CN | 106782307 A | 5/2017 |
| CN | 104597655 B | 6/2017 |
| CN | 106935618 A | 7/2017 |
| CN | 106935630 A | 7/2017 |
| CN | 107248378 A | 10/2017 |
| CN | 107256695 A | 10/2017 |
| CN | 107275359 A | 10/2017 |
| CN | 107393468 A | 11/2017 |
| CN | 107481671 A | 12/2017 |
| CN | 107644888 A | 1/2018 |
| CN | 107665684 A | 2/2018 |
| CN | 107817632 A | 3/2018 |
| CN | 107910348 A | 4/2018 |
| CN | 207781607 U | 8/2018 |
| CN | 207781608 U | 8/2018 |
| CN | 207883217 U | 9/2018 |
| CN | 109491158 A | 3/2019 |
| CN | 109559679 A | 4/2019 |
| EP | 2 680 310 A1 | 1/2014 |
| EP | 2 709 155 A1 | 3/2014 |
| JP | 2002-221917 A | 8/2002 |
| JP | 2005-091875 A | 4/2005 |
| JP | 2008-015521 A | 1/2008 |
| JP | 2008-197491 A | 8/2008 |
| JP | 2016-090991 A | 5/2016 |
| KR | 10-2009-0049515 A | 5/2009 |
| KR | 10-2011-0108050 A | 10/2011 |
| KR | 10-2013-0101874 A | 9/2013 |
| KR | 10-1347995 B1 | 1/2014 |
| KR | 10-2015-0006668 A | 1/2015 |
| KR | 10-2016-0051511 A | 5/2016 |
| KR | 10-2017-0116556 A | 10/2017 |
| RU | 2 453 879 C2 | 6/2012 |
| WO | 2016192241 A1 | 12/2016 |
| WO | 2017/140038 A1 | 8/2017 |
| WO | 2018014562 A1 | 1/2018 |
| WO | 2019084932 A1 | 5/2019 |
| WO | 2019134514 A1 | 7/2019 |
| WO | 2019134522 A1 | 7/2019 |
| WO | 2019153949 A1 | 8/2019 |
| WO | 2020124693 A1 | 6/2020 |

OTHER PUBLICATIONS

Notice of Allowance in U.S. Appl. No. 16/600,316 dated Apr. 14, 2021.
Extended European Search Report in European Patent Application EP21152119.0 dated May 11, 2021.
Indian Office Action in Indian Application No. 202017026082 dated May 25, 2021.
First Office Action in U.S. Appl. No. 15/578,481 dated Feb. 1, 2019.
English translation of the International Search Report of PCT/CN2017/075957, dated Jun. 8, 2017.
International Preliminary Report on Patentability of PCT/CN2017/075957, dated Jan. 22, 2019 and English Translation of the Written Opinion of the International Searching Authority of PCT/CN2017/075957, dated Jun. 8, 2017.
International Search Report of PCT/CN2018/124881 in Chinese, dated Mar. 26, 2019, with English translation.
International Search Report of PCT/CN2016/081097 in Chinese, dated Nov. 16, 2016, with English translation.
International Preliminary Report on Patentability of PCT/CN2016/081097, dated Aug. 21, 2018 and Written Opinion of the International Searching Authority of PCT/CN2016/081097 in Chinese, dated Nov. 16, 2016 with English translation.
First Office Action in U.S. Appl. No. 15/536,347 dated Aug. 28, 2018.
English translation of Extended European Search Report in EP Application No. 16890271.6 dated Sep. 25, 2019.
Chinese Office Action in Chinese Application No. 201810135947.1, dated Mar. 3, 2020 with English translation.
Indian Office Action in Indian Application No. 201717038562, dated Oct. 15, 2019.
English translation of Extended European Search Report in EP Application No. 17768339.8 dated Dec. 6, 2019.
Korean Office Action in Korean Application No. 10-2017-7022698, dated May 29, 2019 with English translation.
Korean Notice of Allowance in Korean Application No. 10-2017-7022698, dated Mar. 6, 2020.
International Search Report of PCT/CN2018/124890 in Chinese, dated Mar. 27, 2019, with English translation.
Russian Search Report in Russian Application No. 2019130488, dated Jan. 16, 2020, with English translation.
International Search Report of PCT/CN2018/124884 in Chinese, dated Mar. 27, 2019, with English translation.
International Search Report of PCT/CN2018/124386 in Chinese, dated Mar. 29, 2019, with English translation.
International Search Report of PCT/CN2018/124445 in Chinese, dated Mar. 21, 2019, with English translation.
International Search Report of PCT/CN2018/124404 in Chinese, dated Mar. 14, 2019, with English translation.
Candice H. Brown Elliot, "Reducing Pixel Count Without Reducing Image Quality", Information display, vol. 1999 (12):22~25, 1999 (4 pages).
Lu Fang et al., "Subpixel Rendering: From Font Rendering to Image Subsampling", IEEE Signal Processing Magazine, vol. 2013 (5): 177~182 and 189, 2013 (7 pages).
Dean S. Messing, Scott Daly, "Improved Display Resolution of Subsampled Colour Images Using Subpixel Addressing", IEEE ICIP 2002:I-625~628, 2002 (4 pages).
Huang et al., "RGB to RGBG conversion algorithm based on weighting factors and related FPGA realization", China Academic Journal Electronic Publishing House, vol. 32, No. 7, Jul. 2017, pp. 572-579 (8 pages).
Korean Office Action in Korean Application No. 10-2019-7024785, dated Jul. 30, 2020 with English translation.
Notice of Allowance in U.S. Appl. No. 16/234,777 dated Sep. 1, 2020.
First Office Action in U.S. Appl. No. 16/621,918 dated Sep. 29, 2020.
First Office Action in U.S. Appl. No. 16/600,316 dated Oct. 6, 2020.
First Office Action in U.S. Appl. No. 16/492,930 dated Jul. 24, 2020.
Non-Final Office Action in U.S. Appl. No. 15/578,481 dated Jul. 11, 2019.
Indian Office Action in Indian Application No. 202017026082 dated May 25, 2021 with English translation.
U.S. Non-Final Office Action in U.S. Appl. No. 16/621,904 dated Aug. 2, 2021.
Park et al., Luminance Uniformity of Large-Area OLEDs With an Auxiliary Metal Electrode, Journal of Display Technology, Downloaded on Jun. 2, 2021 from IEEE Xplore, Aug. 2009, pp. 306-311, vol. 5, No. 8.
Japanese Office Action in Japanese Application No. 2017-544608, dated Oct. 12, 2020 with English translation.
Korean Office Action in Korean Application No. 10-2019-7027773, dated Dec. 25, 2020 with English translation.
Indian Office Action in Indian Application No. 202017027785 dated Aug. 19, 2021 with English translation.
U.S. Office Action in U.S. Appl. No. 16/483,210 dated Sep. 22, 2021.

(56) References Cited

OTHER PUBLICATIONS

Extended European Search Report in European Application No. 18905693.0 dated Oct. 1, 2021.
Extended European Search Report in European Application No. 18905189.9 dated Oct. 19, 2021.
Extended European Search Report in European Application No. 18903035.6 dated Nov. 8, 2021.
Indian Office Action in Indian Application No. 202027048001 dated Dec. 6, 2021 with English translation.
Korean Office Action in Korean Application No. 10-2021-7030323 dated Jan. 25, 2022 with English translation.
U.S. Office Action in U.S. Appl. No. 16/621,904 dated Mar. 15, 2022.
U.S. Office Action in U.S. Appl. No. 17/170,457 dated Mar. 31, 2022.
First Chinese Office Action in Chinese Application No. 201680082630.5 dated Apr. 1, 2022 with English translation.
Notice of Allowance in U.S. Appl. No. 16/755,970 dated May 6, 2022.
U.S. Office Action in U.S. Appl. No. 17/497,630 dated May 12, 2022.

\* cited by examiner

DISPLAY DEVICE COMPRISING A SPECIFIED ARRANGEMENT OF SUB-PIXELS AND SPACERS

CROSS REFERENCE TO RELATED APPLICATIONS

This application is the National Stage of PCT/CN2018/124881 filed on Dec. 28, 2018, which claims priority under 35 U.S.C. § 119 of Chinese Application No. 201810135948.6 filed on Feb. 9, 2018, the disclosure of which is incorporated by reference.

TECHNICAL FIELD

Embodiments of the present disclosure relates to a display substrate and a display device.

BACKGROUND

With the continuous development of display technology, people have higher and higher requirements for the resolution of display devices. Due to the advantages of high display quality, the application range of high-resolution display devices is becoming wider and wider. In general, the resolution of a display device can be improved by reducing the size of pixels and reducing the spacing between pixels. However, the reduction in the size of pixels and the spacing between pixels also requires higher and higher precision of the manufacturing process, which leads to the increase in the difficulty of the manufacturing process and the manufacturing cost of the display device.

On the other hand, sub-pixel rendering (SPR) technology can make use of the difference of human eyes' resolution to sub-pixels of different colors, change the mode of defining a pixel simply by conventional red, green and blue sub-pixels, share sub-pixels of certain position resolution insensitive colors among different pixels, and use relatively few sub-pixels to simulate and realize the same pixel resolution performance capability, thus reducing the difficulty of the manufacturing process and the manufacturing cost.

In display devices, spacers are usually provided to play a supporting role.

SUMMARY

Embodiments of the present disclosure provide a display substrate and a display device to reduce color shift under different viewing angles and improve display quality.

At least one embodiment of the present disclosure provides a display substrate, including: a first sub-pixel, a second sub-pixel and a first spacer; a connection line between a center of the first sub-pixel and a center of the second sub-pixel is a center connection line, the center connection line is not perpendicular to a first direction, and the first direction is at least one selected from the group consisting of a row direction and a column direction; the first spacer is between the first sub-pixel and the second sub-pixel, and an extension direction of the first spacer between the first sub-pixel and the second sub-pixel is not perpendicular to the first direction.

For example, the extension direction of the first spacer has an included angle with the first direction, and a range of the included angle is 40°-50° or 130°-140°.

For example, the included angle is 45° or 135°.

For example, the center connection line is not parallel to the first direction.

For example, the display substrate includes a plurality of pixel groups, each of the plurality of pixel groups includes one first sub-pixel, one second sub-pixel, one third sub-pixel and one fourth sub-pixel; and the first spacer is between the first sub-pixel and the second sub-pixel which belong to different ones of the plurality of pixel groups.

For example, in each of the plurality of pixel groups, a connection line between the center of the second sub-pixel and a center of the third sub-pixel is a first line segment; the first sub-pixel and the fourth sub-pixel are between the second sub-pixel and the third sub-pixel and are respectively on two sides of the first line segment; a connection line between the center of the first sub-pixel and a center of the fourth sub-pixel is a second line segment; a length of the second line segment is smaller than a length of the first line segment.

For example, a ratio of the length of the second line segment to the length of the first line segment is less than or equal to 3/4.

For example, the display substrate further includes: a second spacer, the second spacer is between two adjacent ones of the plurality of pixel groups, and the second spacer is between the fourth sub-pixel and the second sub-pixel which belong to different ones of the plurality of pixel groups, or between the fourth sub-pixel and the third sub-pixel which belong to different ones of the plurality of pixel groups; an extension direction of the second spacer between the fourth sub-pixel and the second sub-pixel or between the fourth sub-pixel and the third sub-pixel is not perpendicular to the first direction.

For example, the first spacer is between the first sub-pixel and the second sub-pixel which belong to two adjacent ones of the plurality of pixel groups, and/or between the first sub-pixel and the fourth sub-pixel which belong to two adjacent ones of the plurality of pixel groups.

For example, the first spacer and the second spacer around the second sub-pixel or the fourth sub-pixel form a spacer pair, and the first spacer and the second spacer in the spacer pair are on the same side of the second sub-pixel or the third sub-pixel.

For example, in the same one of the plurality of pixel groups, no spacer is among the first sub-pixel, the second sub-pixel, the third sub-pixel and the fourth sub-pixel.

For example, in each of the plurality of pixel groups, the first sub-pixel and the fourth sub-pixel are both strip-shaped, and an extension direction of the first sub-pixel and an extension direction of the fourth sub-pixel do not coincide.

For example, an included angle between the extension direction of the first sub-pixel and the extension direction of the fourth sub-pixel ranges from 70° to 100°.

For example, the first sub-pixel and the fourth sub-pixel are symmetrically arranged relative to the first line segment, and/or the second sub-pixel and the third sub-pixel are symmetrically arranged relative to the second line segment.

For example, the first line segment extends in the first direction and the second line segment extends in a second direction; the plurality of pixel groups are arranged in an array to form a plurality of rows and a plurality of columns, and pixel groups of even rows and pixel groups of odd rows are arranged in a staggered way; a length of a center connection line between the second sub-pixel and third sub-pixel which are adjacent to each other in two adjacent ones of the plurality of pixel groups in the first direction is less than the length of the first line segment; in two adjacent ones of the odd rows or in two adjacent ones of the even rows, a length of a center connection line between the first sub-pixel and fourth sub-pixel which are adjacent to each other in two adjacent ones of the plurality of pixel groups in the second direction is greater than the length of the second line segment.

For example, an extension line of the second line segment of each pixel group passes through a midpoint of a center connection line between two pixel groups which are adjacent to the pixel group in the second direction and are in the same row.

For example, in two adjacent ones of the odd rows or in two adjacent ones of the even rows, an intersection point of a center connection line between two third sub-pixels in two adjacent ones of the plurality of pixel groups arranged in the second direction and the first line segment in one pixel group between the two third sub-pixels is between a center of the first line segment and the center of the second sub-pixel of the one pixel group.

For example, at least one selected from the group consisting of the first sub-pixel and the fourth sub-pixel is a sub-pixel with a human eye sensitive color.

For example, in the first direction, widths of the first sub-pixel, the second sub-pixel, the third sub-pixel and the fourth sub-pixel are the same.

For example, the first line segment extends in the first direction and the second line segment extends in the second direction, the first spacer and the second spacer have elongated shapes, and extension directions of the elongated shapes are different from the first direction and the second direction.

For example, at least one selected from the group consisting of the first spacer and the second spacer does not overlap with the center connection line between the first sub-pixel and the third sub-pixel.

For example, the first line segment extends in the first direction and the second line segment extends in the second direction, and an orthographic projection of the first spacer on a straight line in the first direction does not overlap or partially overlap with an orthographic projection of at least one selected from the group consisting of the second sub-pixel and the third sub-pixel on a straight line in the first direction.

For example, a ratio of a sum of numbers of the first spacer and the second spacer to a number of sub-pixels is 0.3-1, and the sub-pixels include the first sub-pixel, the second sub-pixel, the third sub-pixel and the fourth sub-pixel.

For example, the first spacer and the second spacer are both transparent spacers.

At least one embodiment of the present disclosure further provides a display substrate, including:

a pixel arrangement structure including a plurality of pixel groups; each of the plurality of pixel groups includes a first sub-pixel, a second sub-pixel, a third sub-pixel and a fourth sub-pixel; in each of the plurality of pixel groups, a connection line between a center of the second sub-pixel and a center of the third sub-pixel is a first line segment; the first sub-pixel and the fourth sub-pixel are between the second sub-pixel and the third sub-pixel and are respectively at two sides of the first line segment; a connection line between a center of the first sub-pixel and the center of the fourth sub-pixel is a second line segment; a length of the second line segment is less than a length of the first line segment;

the display substrate further includes at least one of the following spacers:

a first spacer between the first sub-pixel and the second sub-pixel which are adjacent to each other in two adjacent ones of the plurality of pixel groups;

a second spacer between the fourth sub-pixel and the second sub-pixel which are adjacent to each other in two adjacent ones of the plurality of pixel groups; and a third spacer between the first sub-pixel and the fourth sub-pixel in each of the plurality of pixel groups.

For example, the plurality of pixel groups are arranged in an array to form a plurality of rows and a plurality of columns, and pixel groups of even rows and pixel groups of odd rows are arranged in a staggered way.

For example, the pixel groups of the even rows and the pixel groups of the odd rows are offset by a length of half a pixel group in a first direction, and the first direction is a row direction.

At least one embodiment of the present disclosure further provides a display device, including the display substrate according to at least one embodiment of the present disclosure.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Figure 1A:
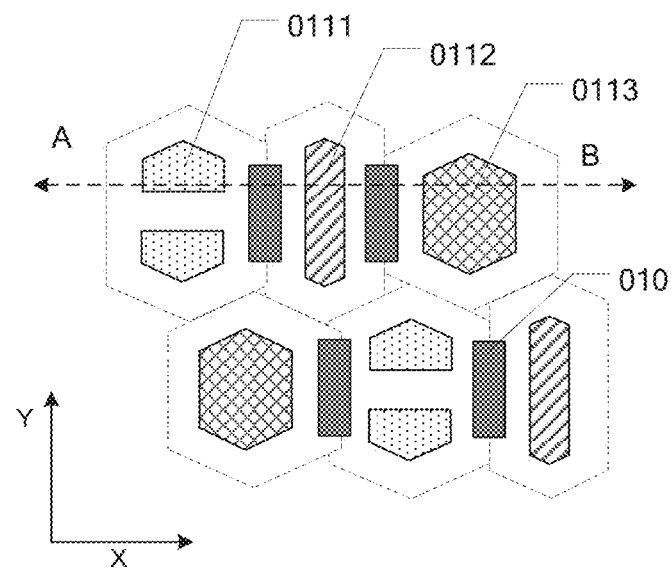
FIG. 1A is a schematic diagram of a display substrate.

FIG. 1A illustrates a display substrate. As illustrated by FIG. 1A, the display substrate includes a pixel arrangement structure, which is a typical pentile arrangement. A minimum repeating unit includes two green sub-pixels 0111, a red sub-pixel 0112 and a blue sub-pixel 0113. The pixels are uniformly distributed, and high pixel per inch (PPI) display is easy to realize. In each row, the minimum repeating units are arranged in a first direction X, and spacers 010 are provided between adjacent sub-pixels that are in the same minimum repeating unit or between different minimum repeating units. The spacers 010 extend in a second direction Y. The first direction X is perpendicular to the second direction Y.

Figure 1B:
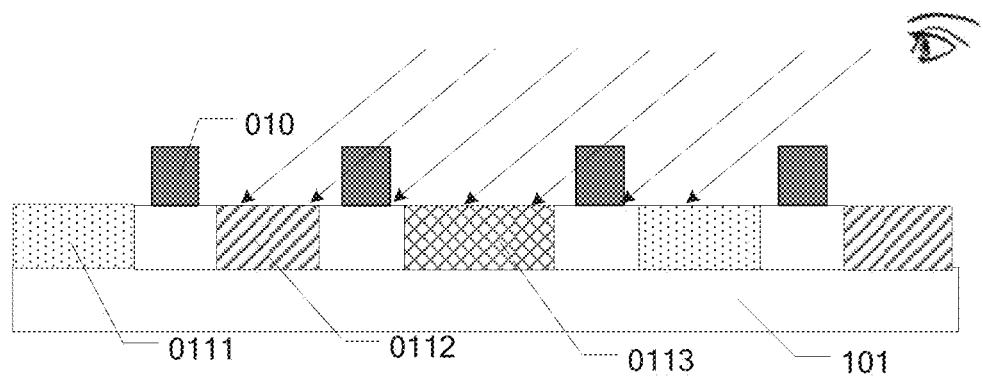
FIG. 1B is a schematic cross-sectional view of a display substrate.

FIG. 1B illustrates a schematic cross-sectional view of a display substrate, which may be a cross-sectional view taken along the direction AB in FIG. 1A. As illustrated by FIG. 1B, a green sub-pixel 0111, a red sub-pixel 0112, a blue sub-pixel 0113, and spacers 010 are disposed on a base substrate 101. Upon the display substrate being viewed at a certain angle, the spacers have different influence on the luminous brightness of each sub-pixel, resulting in viewing angle color shift. For example, upon the display substrate being viewed at different angles along the first direction X, the spacers 010 block light of some sub-pixels from entering the human eye, thereby forming color shift at different viewing angles. That is, upon the same picture being viewed from the left and right sides of FIG. 1B, there is a viewing angle color shift.

Figure 1C:
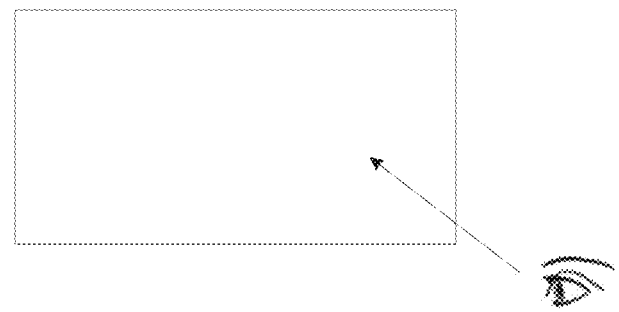
FIG. 1C is a schematic view of a display device viewed at a certain viewing angle.

FIG. 1C illustrates a schematic view of a display device viewed at a certain viewing angle. FIG. 1C shows an example of a display device being viewing on the right side of the display device. Because the spacers 010 block light of some sub-pixels, upon the display device being viewed from the left side, the color of the same picture is different from that when viewing from the right side.

Figure 2A:
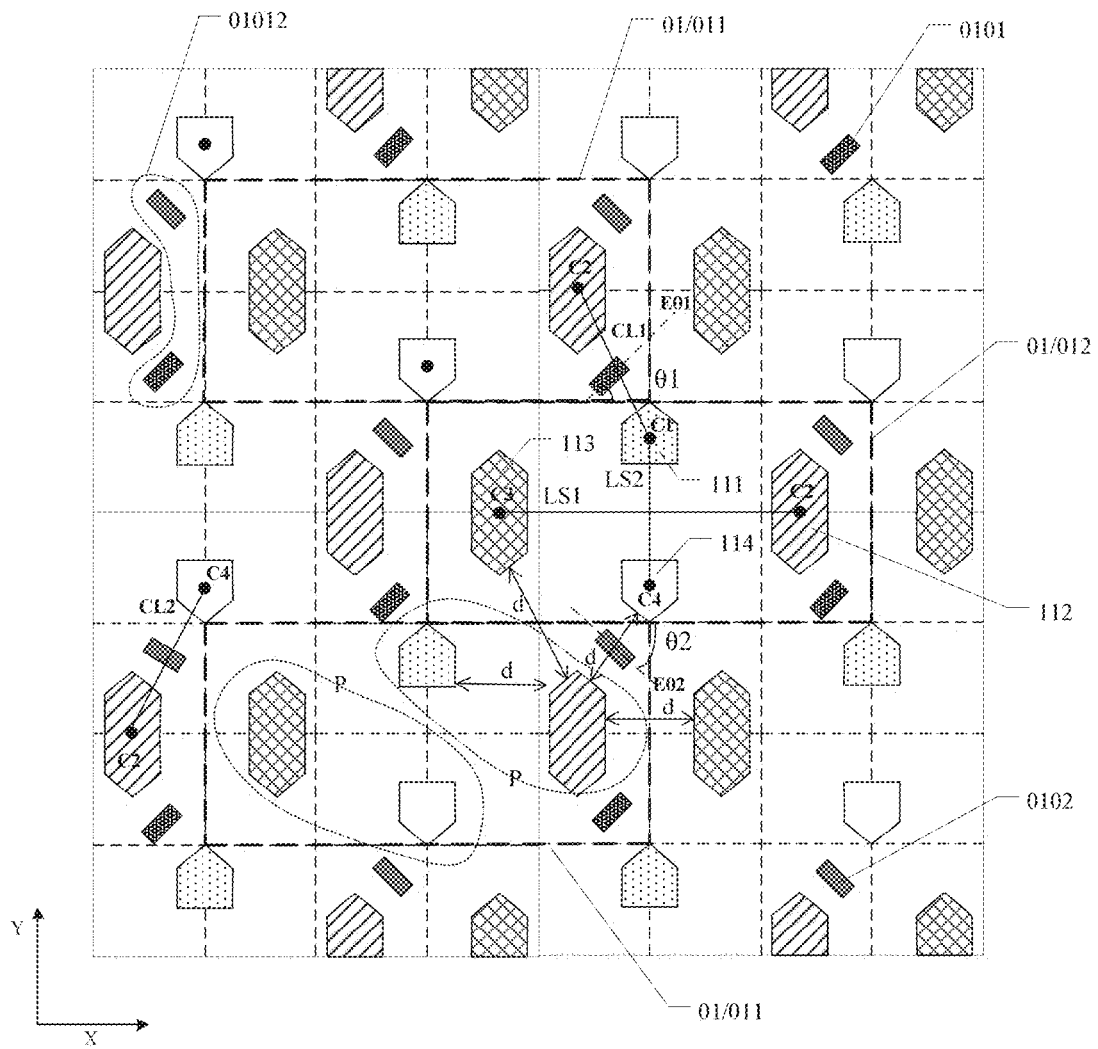
FIG. 2A is a schematic diagram of a display substrate according to an embodiment of the present disclosure.

FIG. 2A illustrates a display substrate according to at least one embodiment of the present disclosure. The display substrate includes a first sub-pixel 111, a second sub-pixel 112, and a first spacer 0101. A connection line between a center C1 of the first sub-pixel 111 and a center C2 of the second sub-pixel 112 is a center connection line CL1, which is not perpendicular to the first direction X, and the first direction X is at least one of the row direction or the column direction.

The first spacer 0101 is disposed between the first sub-pixel 111 and the second sub-pixel 112, and an extension direction of the first spacer 0101 between the first sub-pixel 111 and the second sub-pixel 112 is not perpendicular to the first direction X.

For example, the first spacer 0101 extends between the first sub-pixel 111 and the second sub-pixel 112, and the extension direction E01 of the first spacer 0101 is not perpendicular to the first direction X. In this embodiment of the present disclosure, the first direction X being the row direction is taken as an example to explain. The extension direction E01 of the first spacer 0101 is different from the first direction and the second direction.

In the display substrate provided by at least one embodiment of the present disclosure, the arrangement mode of the spacers is adjusted, and upon the extension direction E01 of the first spacer 0101 being not perpendicular to the first direction X, the shielding of the first spacer to the first sub-pixel 111 can be reduced, and the viewing angle color shift when viewing a picture under different viewing angles can be further reduced.

As illustrated by FIG. 2A, in the display substrate provided by one or more embodiments of the present disclosure, in order to reduce the shielding of the first sub-pixel 111 by the first spacer 0101, the extension direction E01 of the first spacer 0101 has an included angle θ1 with the first direction X. For example, the included angle θ1 ranges from 40 to 50 degrees or from 130 to 140 degrees. Further, for example, the included angle θ1 is 45 degrees or 135 degrees. In this case, the first spacer 0101 has the smallest shielding to the first sub-pixel 111, which can greatly improve the viewing angle color shift.

As illustrated by FIG. 2A, in the display substrate provided by one or more embodiments of the present disclosure, the center connection line CL is not parallel to the first direction X.

As illustrated by FIG. 2A, in the display substrate provided by one or more embodiments of the present disclosure, the second sub-pixel 112 is included in the first pixel group 011 and the first sub-pixel 111 is included in the second pixel group 012. The first pixel group 011 further includes one first sub-pixel 111, one third sub-pixel 113, and one fourth sub-pixel 114, and the second pixel group 012 further includes one second sub-pixel 112, one third sub-pixel 113, and one fourth sub-pixel 114. In the first pixel group 011 and the second pixel group 012, a connection line between the center C2 of the second sub-pixel 112 and the center C3 of the third sub-pixel 113 is a first line segment LS1; the first sub-pixel 111 and the fourth sub-pixel 114 are located between the second sub-pixel 112 and the third sub-pixel 113, and are respectively located on both sides of the first line segment LS1. The first pixel group 011 and the second pixel group 012 are adjacent in the column direction and staggered in the row direction. For example, both the first pixel group 011 and the second pixel group 012 can be referred to as pixel group 01.

As illustrated by FIG. 2A, in the display substrate provided by one or more embodiments of the present disclosure, in the first pixel group 011 and the second pixel group 012, a connection line between the center C1 of the first sub-pixel 111 and the center C4 of the fourth sub-pixel 114 is a second line segment LS2; the ratio of the length of the second line segment LS2 to the length of the first line segment LS1 is less than or equal to 3/4. Thus, upon the first sub-pixel 111 and the fourth sub-pixel 114 being sub-pixels of the same color, the light emitting layer patterns of the first sub-pixel 111 and the fourth sub-pixel 114 in the same pixel group 01 can be formed by vapor deposition using the same opening of the mask plate.

In the display substrate provided by one or more embodiments of the present disclosure, the first spacer 0101 may be disposed between the first sub-pixel 111 and the second sub-pixel 112 of two adjacent ones of the plurality of pixel groups and/or disposed between the first sub-pixel 111 and the fourth sub-pixel 114 of two adjacent ones of the plurality of pixel groups.

As illustrated by FIG. 2A, the display substrate according to one or more embodiments of the present disclosure further includes a second spacer 0102, the second spacer 0102 is located between adjacent pixel groups 01, the second spacer 0102 is located between the fourth sub-pixel 114 and the second sub-pixel 112 which belong to different ones of the plurality of pixel groups 01, or is located between the fourth sub-pixel 114 and the third sub-pixel 113 which belong to different ones of the plurality of pixel groups; an extension direction of the second spacer 0102 between the fourth sub-pixel 114 and the second sub-pixel 112 or between the fourth sub-pixel 114 and the third sub-pixel 113 is not perpendicular to the first direction X.

For example, the second spacer 0102 extends between the fourth sub-pixel 114 and the second sub-pixel 112 which belong to different ones of the plurality of pixel groups 01, or extends between the fourth sub-pixel 114 and the third sub-pixel 113 which belong to different ones of the plurality of pixel groups 01. The extension direction E02 of the second spacer 0102 is not perpendicular to the first direction X. For example, the extension direction E02 of the second spacer 0102 is different from the first direction and the second direction.

For example, the display substrate includes a plurality of first pixel groups 011 located in odd rows and a plurality of second pixel groups 012 located in even rows. The display substrate further includes a second spacer 0102, and the second spacer 0102 extends between the fourth sub-pixel 114 in at least one selected from the group consisting of the first pixel group 011 and the second pixel group 012 and at least one selected from the group consisting of the second sub-pixel 112 and the third sub-pixel 113 adjacent thereto in the column direction. The extension direction E02 of the second spacer 0102 is not perpendicular to the first direction X.

For example, in order to reduce the shielding of the fourth sub-pixel 114 by the second spacer 0102, the extension direction E02 of the second spacer 0102 has an included angle θ2 with the first direction X. For example, the included angle θ2 ranges from 40 to 50 degrees or from 130 to 140 degrees. Further, for example, the included angle θ2 is 45 degrees or 135 degrees. In this case, the second spacer has the smallest shielding to the fourth sub-pixel 114, which can further reduce the shielding to the pixels sensitive to human eyes and greatly improve the viewing angle color shift.

As illustrated by FIG. 2A, the spacers can have elongated shapes, and their extension directions are different from the first direction and the second direction. The spacers include a first spacer 0101 and a second spacer 0102. For example, the shapes of the spacers are orthographic projections of the spacers on the base substrate. Similarly, the shapes of the sub-pixels are the shapes of the orthographic projections of the sub-pixels on the base substrate.

As illustrated by FIG. 2A, a connection line between the center of the fourth sub-pixel 114 in the second pixel group 012 and the center of the third sub-pixel 113 or the fourth sub-pixel 114 in the first pixel group 011 adjacent to the fourth sub-pixel 114 is a center line CL2, and the center line CL2 is not perpendicular to the first direction X.

In the display substrate provided by one or more embodiments of the present disclosure, at least one of the first sub-pixel 111 and the fourth sub-pixel 114 is a sub-pixel with a human eye sensitive color. For example, the second sub-pixel 112 and the third sub-pixel 113 can be sub-pixels of color insensitive to human eyes. In this embodiment of the present disclosure, the shielding of the sensitive color sub-pixels by the first spacer and/or the second spacer can be reduced, so that the color shift under different viewing angles can be reduced. For example, the first spacer and/or the second spacer can be located between sub-pixels of sensitive color and sub-pixels of non-sensitive color.

As illustrated by FIG. 2A, in the display substrate provided by one or more embodiments of the present disclosure, the first spacer 0101 and the second spacer 0102 located around the second sub-pixel 112 or the fourth sub-pixel 114 form a spacer pair 01012, and the first spacer 0101 and the second spacer 0102 in the spacer pair 01012 are located on the same side of the second sub-pixel 112 or the third sub-pixel 113. In FIG. 2A, the spacer pair 01012 is illustrated as being located on the same side of the second sub-pixel 112. The spacer pair 01012 is located around the non-sensitive color sub-pixels, thereby reducing the influence of the spacer pair 01012 on the display color and reducing the viewing angle color shift.

For AMOLED display substrates, spacers have two functions. One function is to support the mask plate for vapor deposition of the light emitting layer pattern, and the other function is to support the cover plate during packaging.

As illustrated by FIG. 2A, in the display substrate provided by one or more embodiments of the present disclosure, in order to reduce the number of spacers in the display substrate and reduce color shift at different viewing angles, spacers are not provided between the first sub-pixel 111, the second sub-pixel 112, the third sub-pixel 113 and the fourth sub-pixel 114 in at least one of the first pixel group 011 and the second pixel group 012 (in the same pixel group 01). For example, in this case, spacer pairs can be provided between the pixel groups 01. For example, three spacer pairs can be formed around each pixel group 01, thereby facilitating the support of the mask plate during the fabrication of the light emitting layer.

Figure 2B:
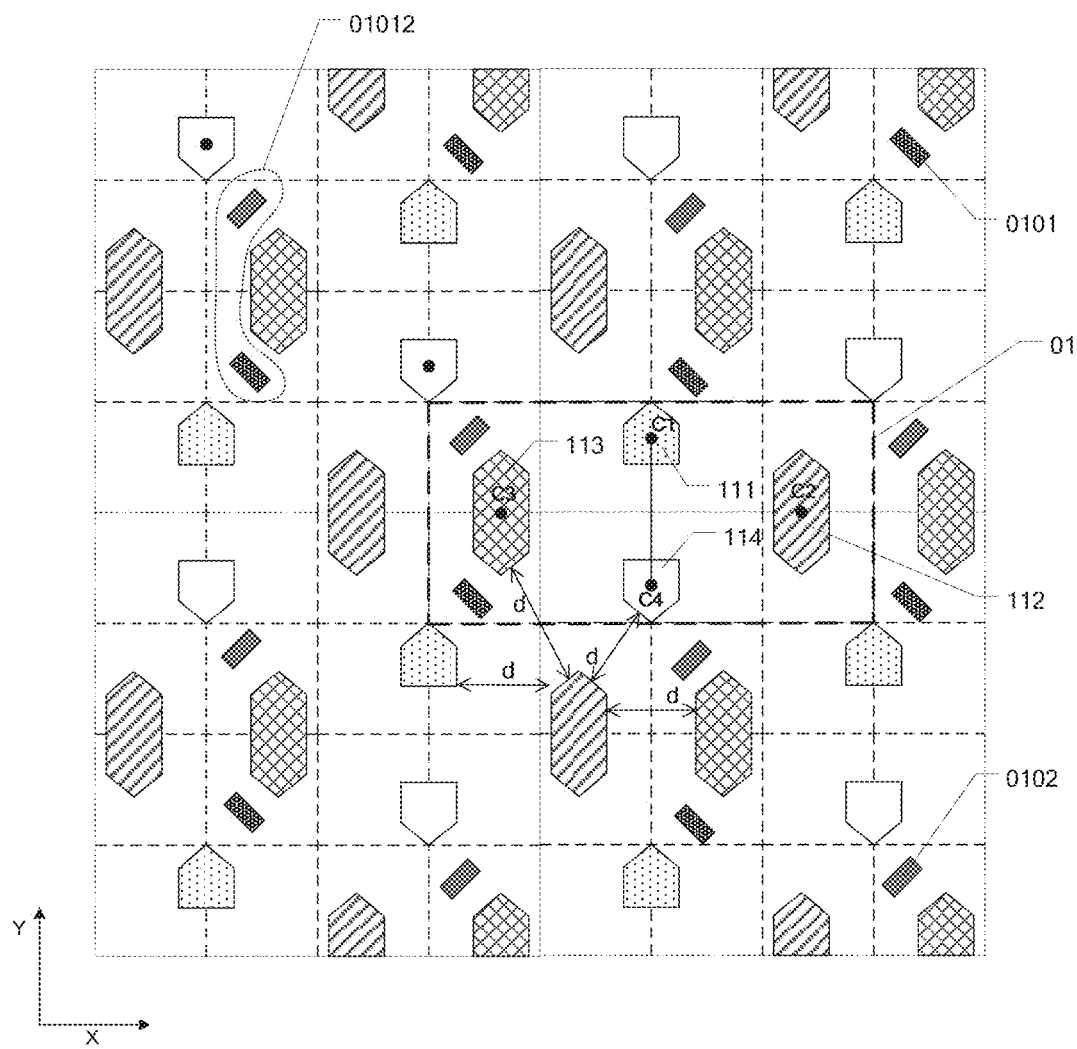
FIG. 2B is a schematic diagram of a display substrate according to another embodiment of the present disclosure.

FIG. 2B illustrates a display substrate provided by at least one embodiment of the present disclosure. In the display substrate, the first spacer 0101 and the second spacer 0102 of the spacer pair 01012 are located on the same side of the third sub-pixel 113.

Figure 2C:
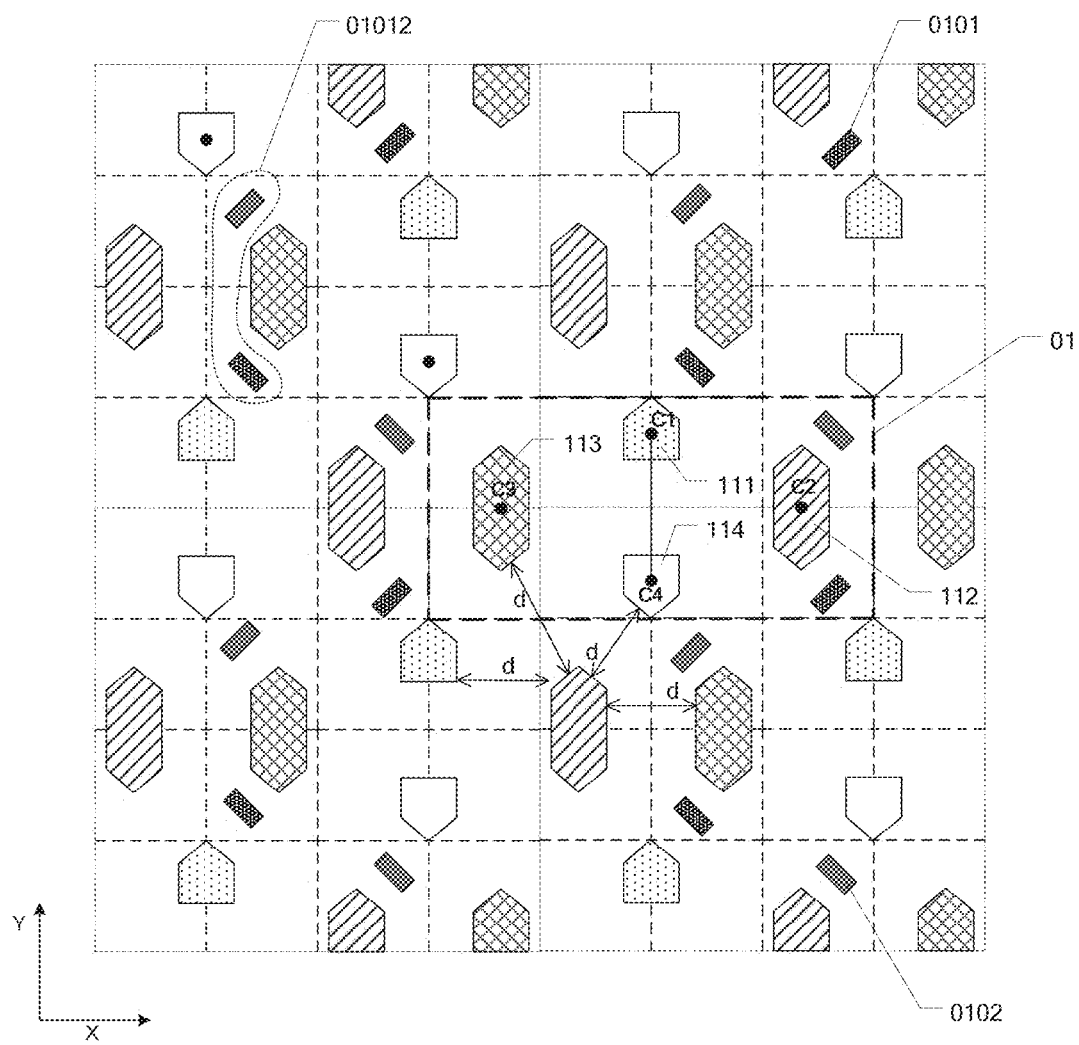
FIG. 2C is a schematic diagram of a display substrate according to another embodiment of the present disclosure.

FIG. 2C illustrates a display substrate provided by at least one embodiment of the present disclosure. The display substrate includes two types of spacer pairs 01012. One type of spacer pair 01012 is located on the same side (e.g., left side) of the third sub-pixel 113 in the first pixel group 011. Another type of spacer pair 01012 is located on the same side (e.g., right side) of the second sub-pixel 112 in the second pixel group 012.

Figure 2D:
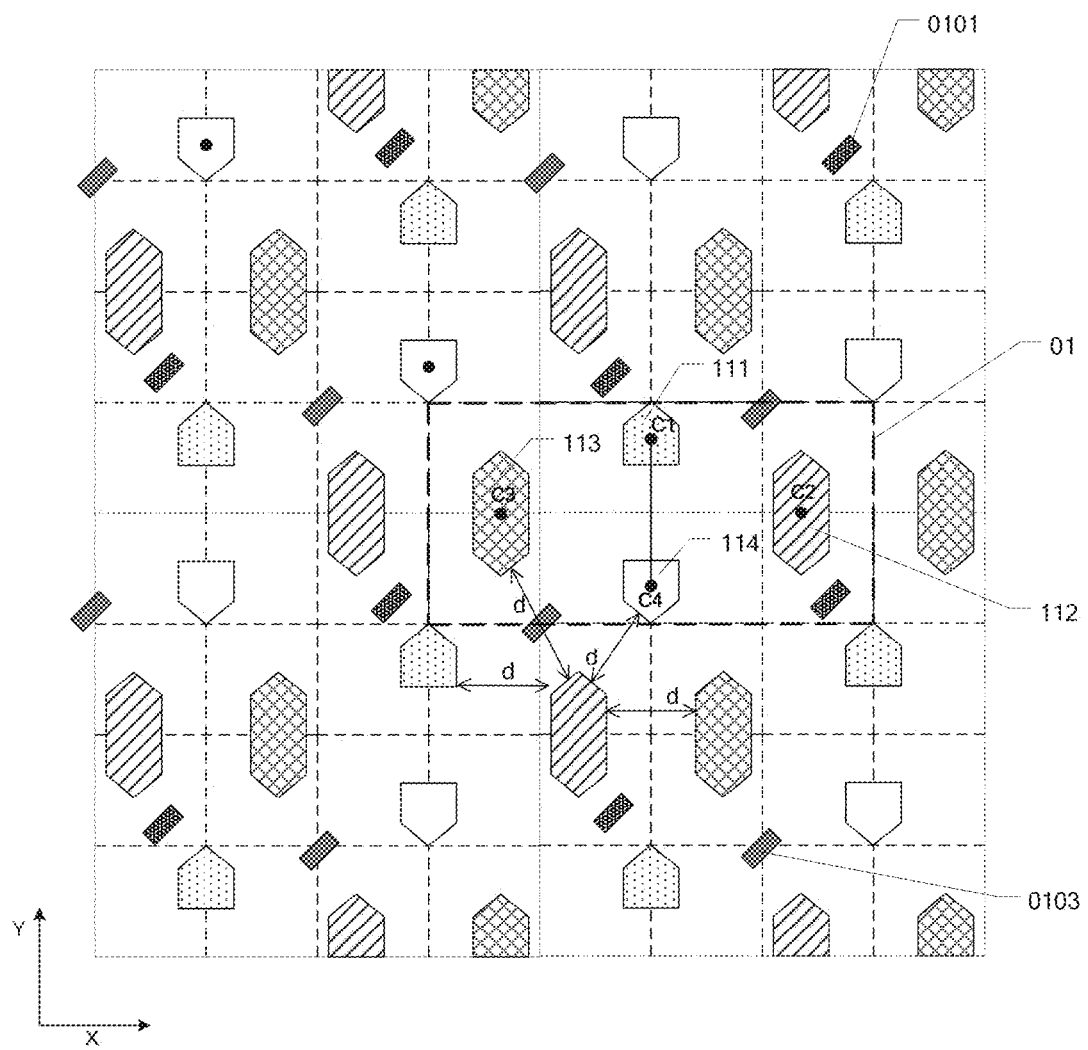
FIG. 2D is a schematic diagram of a display substrate according to an embodiment of the present disclosure.

FIG. 2D illustrates a display substrate provided by at least one embodiment of the present disclosure. The display substrate includes a first spacer 0101 and a third spacer 0103. The third spacer 0103 can be disposed between two non-sensitive colors of different pixel groups 01. For example, between the second sub-pixel 112 and the third sub-pixel 113.

In order to facilitate the description of the pixel arrangement structure, the spacer in the display substrate is removed upon the pixel arrangement structure being described below. The first spacer 0101, the second spacer 0102, the third spacer 0103 and the like in this embodiment of the present disclosure may be disposed in the pixel arrangement structure described below.

Figure 2E:
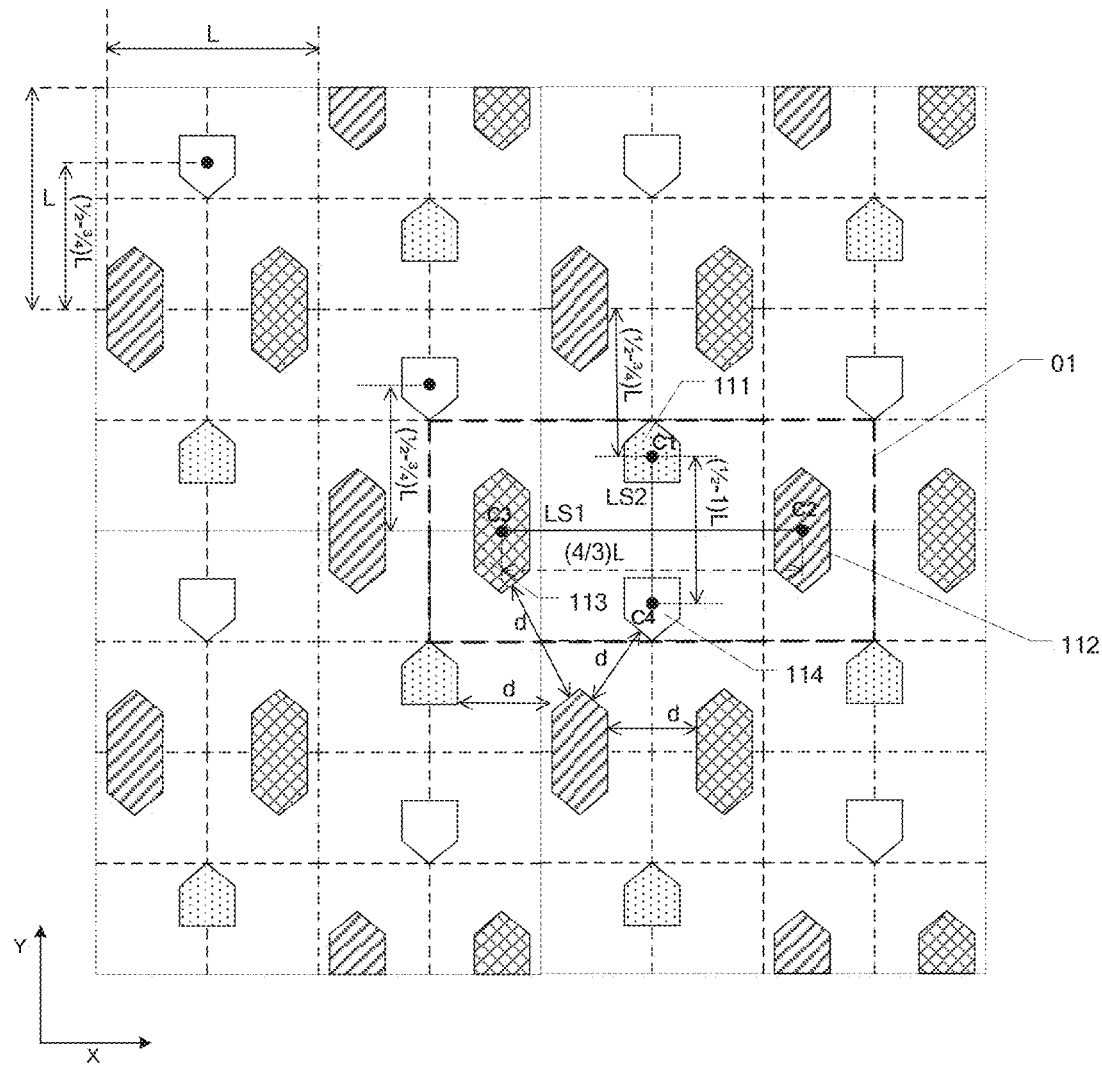
FIG. 2E is a schematic diagram of a pixel arrangement structure in a display substrate according to an embodiment of the present disclosure.

As illustrated by FIG. 2E, at least one embodiment of the present disclosure provides a display substrate, and the pixel arrangement structure includes a plurality of pixel groups 01. Each of the plurality of pixel group 01 includes one first sub-pixel 111, one second sub-pixel 112, one third sub-pixel 113, and one fourth sub-pixel 114. The connection line between the center C2 of the second sub-pixel 112 and the center C3 of the third sub-pixel 113 is a first line segment LS1; the first sub-pixel 111 and the fourth sub-pixel 114 are located between the second sub-pixel 112 and the third sub-pixel 113 and are respectively located on both sides of the first line segment LS1. For example, a connection line between the center C1 of the first sub-pixel 111 and the center C4 of the fourth sub-pixel 114 is a second line segment LS2. The length of the second line segment LS2 is smaller than the length of the first line segment LS1. For example, in order to obtain a better pixels per inch arrangement effect, the ratio of the lengths of the second line segment LS2 and the first line segment LS1 is less than or equal to 3/4.

In the display substrate provided by at least one embodiment of the present disclosure, in the pixel arrangement structure of the display substrate, the distance between the first sub-pixel and the fourth sub-pixel in the same pixel group is reduced, on the one hand, the pixel arrangement can be made tighter, the color mixing risk can be reduced, the color edge can be improved, and the visual graininess can be improved. On the other hand, the spacing between sub-pixels can be widened to facilitate fabrication. Alternatively, a balance can be found between the tightness of pixel arrangement and the spacing between sub-pixels, so that the pixel arrangement is relatively tight and the spacing between sub-pixels (pixel defining layer spacing) is widened to a certain extent, which is beneficial to reducing the risk of color mixing, improving color edges, improving the visual graininess and widening the spacing between sub-pixels. For example, the shape of each sub-pixel given in the embodiments of the present disclosure can be defined by a pixel defining layer, but is not limited thereto. For example, each sub-pixel in the figure is an actual light emitting area. The specific shape of each sub-pixel can be set according to the preparation process. For example, the actual light emitting area can be determined by the shape of at least one of the electrode, the light emitting layer, and the pixel defining layer.

For example, upon the pixel arrangement structure being applied to an OLED display substrate and the first sub-pixel and the fourth sub-pixel are of the same color, the light emitting layer patterns of the first sub-pixel and the fourth sub-pixel in the same pixel group can also be formed by vapor deposition using the same opening of the mask plate.

For example, the first sub-pixel 111 and the fourth sub-pixel 114 can be sub-pixels of human eye sensitive color, for example, may be green sub-pixels, yellow sub-pixels, white sub-pixels, etc. For example, the areas of the first sub-pixel 111 and the fourth sub-pixel 114 are relatively small compared to the second sub-pixel 112 and the third sub-pixel 113. For example, the area of the first sub-pixel 111 is smaller than the area of the second sub-pixel 112, and/or the area of the first sub-pixel 111 is smaller than the area of the third sub-pixel 113. Similarly, the fourth sub-pixel 114 may refer to the above description of the area of the first sub-pixel 111. That is, the area of the fourth sub-pixel 114 is smaller than the area of the second sub-pixel 112, and/or the area of the fourth sub-pixel 114 is smaller than the area of the third sub-pixel 113.

In the display substrate provided by at least one embodiment of the present disclosure, the pixel arrangement structure can improve the distribution uniformity of the sensitive color sub-pixels by adjusting the spacing of the sensitive color sub-pixels in the visual position, thereby improving the visual resolution of the pixel arrangement structure and improving the display quality.

The second sub-pixel 112 and the third sub-pixel 113 may be sub-pixels of color insensitive to human eyes. For example, one of the second sub-pixel 112 and the third sub-pixel 113 is a red sub-pixel and the other is a blue sub-pixel, but is not limited thereto. In this embodiment of the present disclosure, the second sub-pixel 112 is a red sub-pixel and the third sub-pixel 113 is a blue sub-pixel. It should be noted that when the pixel arrangement structure adopts the red green blue (RGB) mode, the above-mentioned human eye sensitive color can be green.

As illustrated by FIG. 2E, the first line segment LS1 can extend in the first direction X and the second line segment LS2 can extend in the second direction Y. For example, the first direction X is perpendicular to the second direction Y. For example, in each pixel group 01, the first sub-pixel 111 and the fourth sub-pixel 114 are arranged with the first direction X as an axis of symmetry, so that the pixel structure is arranged more uniformly. For example, the first sub-pixel 111 is uniformly arranged relative to the second sub-pixel 112 and the third sub-pixel 113, and is kept consistent, so that the pixel structure is arranged more uniformly.

As illustrated by FIG. 2E, in the pixel arrangement structure of the display substrate provided by one or more embodiments of the present disclosure, the second line segment LS2 is perpendicular to the first line segment LS1. Thus, the pixel arrangement can be made more uniform. For example, the second line segment LS2 is located on the perpendicular bisector of the first line segment LS1. In this case, the widths of sub-pixels of each color in the first direction X can be the same, but are not limited thereto. Therefore, the pixel structure distribution can be made more uniform, the picture display quality is higher, and the problem of display graininess at lower PPI is improved.

As illustrated by FIG. 2E, for convenience of description, a plurality of square dashed frames are provided, each dashed frame has a length of ½L, and four dashed frames can form a square with an edge length of L. In FIG. 2E, there is a pixel group 01 in the dark rectangle dashed frame. The pixel group 01 can be the minimum repeating unit of the pixel arrangement structure. For example, the pixel arrangement structure can be obtained by translating and copying the minimum repeating unit. For example, sub-units that can be translated and repeated to be arranged to form a pixel structure are not included in the minimum repeating unit. For example, as illustrated by FIG. 2, the dark rectangular dashed frame has a length of 2 L and a width of L.

As illustrated by FIG. 2E, the first line segment SL1 is perpendicular to the second line segment SL2 and is vertically bisected with each other. The first line segment SL1 vertically bisects the second line segment SL2. The second line segment SL2 also vertically bisects the first line segment SL1. For example, in the pixel group 01, the maximum area enclosed by the connection lines between the centers of the first sub-pixel 111, the second sub-pixel 112, the fourth sub-pixel 114 and the third sub-pixel 113 is rhombus, and the first line segment SL and the second line segment SL2 are respectively diagonal lines of the rhombus.

As illustrated by FIG. 2E, in the pixel group 01, the distance between the center C1 of the first sub-pixel 111 and the center C4 of the fourth sub-pixel 114 can be greater than or equal to ½L, for example, the distance can range from ½L to L. For example, the first sub-pixel 111 and the fourth sub-pixel may adopt sub-pixels of the same color. When the first sub-pixel 111 and the fourth sub-pixel adopt sub-pixels of the same color, such as the first sub-pixel 111, the setting of the distance can also avoid the situation that two adjacent first sub-pixels are difficult to distinguish due to the close distance between the adjacent first sub-pixels and are combined into one by human vision, thus avoiding the graininess caused thereby. Therefore, the pixel arrangement structure can improve the distribution uniformity of the first sub-pixels, thereby improving the visual resolution and also improving the display quality.

As illustrated by FIG. 2E, the distance between the center C3 of the third sub-pixel 113 and the center C2 of the second sub-pixel 112 can be 4/3 L. In order to make the ratio of the length of the second line segment LS2 to the length of the first line segment LS1 less than or equal to ¾, the distance between the third sub-pixel 113 and the second sub-pixel 112 in the same pixel group can be increased and/or the distance between the first sub-pixel 111 and the fourth sub-pixel 114 can be decreased under the condition permitted by the process.

As illustrated by FIG. 2E, in the display substrate provided by one or more embodiments of the present disclosure, in order to obtain a closely arranged pixel structure, the ratio of the lengths of the second line segment LS2 and the first line segment LS1 can be greater than or equal to 3/8.

Please continue to refer to FIG. 2A, as illustrated by FIG. 2A, at least one of the first spacer 0101 and the second spacer 0102 does not overlap with the center connection line between the first sub-pixel 111 and the third sub-pixel 113. For example, at least one of the first spacer 0101 and the second spacer 0102 does not overlap with the center connection line between the blue sub-pixel and the green sub-pixel.

For example, in order to reduce color shift at different viewing angles, the orthographic projection of the first spacer 0101 on a straight line in the first direction does not overlap or partially overlap with the orthographic projection of at least one of the second sub-pixel 112 and the third sub-pixel 113 on the straight line in the first direction.

For example, the ratio of the sum of the numbers of the first spacers 0101 and the second spacers 0102 to the number of sub-pixels is 0.3-1. For example, the sub-pixels include the first sub-pixels 111, the second sub-pixels 112, the third sub-pixels 113, and the fourth sub-pixels 114. For example, in the same pixel group, the ratio of the sum of the numbers of the first spacer 0101 and the second spacer 0102 to the number of sub-pixels is 0.3-1.

The position design of the spacer to prevent angle color shift has been described above. However, embodiments of the present disclosure also provide another solution for spacers. For example, a transparent spacer can be used to prevent angle color shift. The position of the transparent spacer is not limited to the above position. For example, the transparent spacer can use a material with high light transmittance or even full transparency and meeting other alternative requirements instead of polyimide material with poor light transmittance. At this time, no matter from which angle the screen is viewed, since the selected material has high light transmittance and has no selectivity for light transmission of different wavelengths, both red light and blue light can normally emit without being blocked by the spacer. The normal light emission has nothing to do with the observation angle, thus to some extent improving the problem of angle color shift and asymmetry of left and right viewing angles under the white screen.

Alternative materials for the spacer may be organic silicone. Organic silicone films have excellent heat resistance, low temperature flexibility, high dielectric constant, and insulation properties. In addition, organic silicon films, such as high molecular polymer films using dimethyl siloxane (PDMS) as raw materials, are colorless and optically transparent, and can still achieve very high or even more than 90% light transmittance at millimeter-level thickness, thus enabling the spacer to have good transparency in the visible light range. Taking an organic silicon material N-(trimethoxysiliconpropyl)-4-azide-2,3,5,6-tetrafluorobenzamide (PFPA-silane) as an example, it is shown that the organic silicon material has high light transmittance (close to 80%) and has little difference in light transmittance at different wavelengths.

In addition, the material of the spacer can also be modified, colorless and transparent new polyimide material. Due to many excellent properties of polyimide itself and its modified high light transmittance in the whole visible light band, polyimide can be used as a transparent spacer material. For example, polyimide and silicon dioxide $PI/SiO_2$ composite films can be used. After being modified, the light transmittance of the modified $PI/SiO_2$ composite film is greatly improved compared with that of pure polyimide, and has almost no selectivity to wavelengths in the visible light range, and the light transmittance at different wavelengths is almost the same. Both high transmittance and non-selectivity of light transmittance to wavelength are beneficial to the improvement of angle color shift.

Figure 3A:
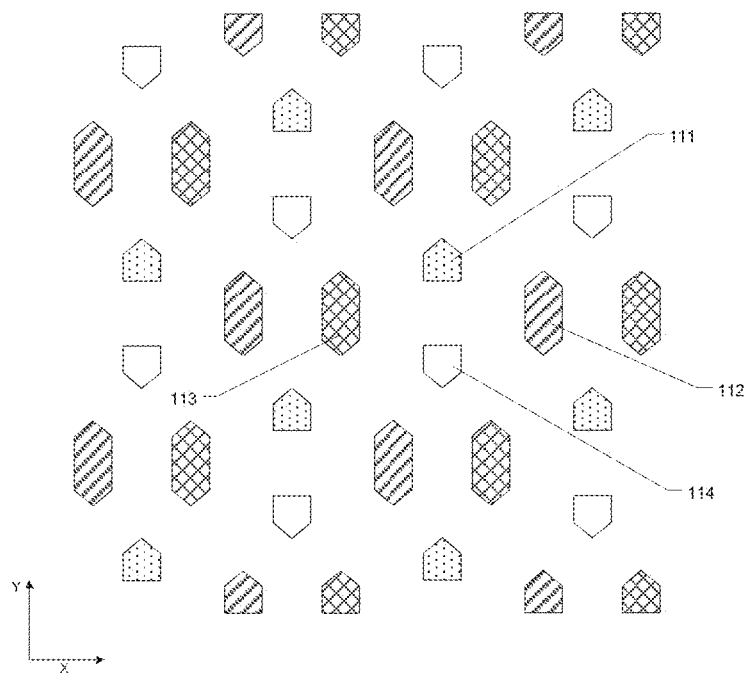
FIG. 3A is a schematic diagram of a pixel arrangement structure in a display substrate according to an embodiment of the present disclosure.

FIG. 3A illustrates the pixel arrangement structure with the dashed lines in FIG. 2E removed. The dashed lines, centers, etc. given in the embodiments of the present disclosure are for convenience of describing the given virtual lines, virtual centers. For example, the center can be the center of gravity, the intersection point of perpendicular bisector of opposite sides, etc., but is not limited thereto.

Figure 3B:
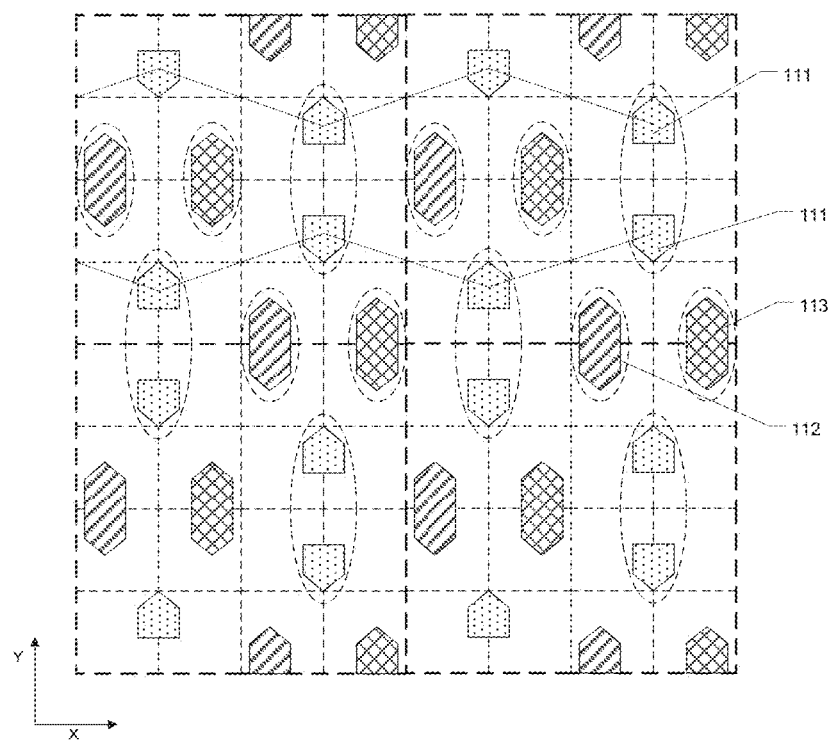
FIG. 3B is a schematic diagram of a pixel arrangement structure in a display substrate according to another embodiment of the present disclosure.

FIG. 3B illustrates a display substrate provided by one or more embodiments of the present disclosure. In the same pixel group 01, the first sub-pixel 111 and the fourth subpixel 114 adopt the same color. For example, both are the first sub-pixel 111. Since the sub-pixels of the same color do not have the problem of color mixing, the light emitting layer patterns of the first sub-pixel 111 and the fourth sub-pixel 114 in the same pixel group 01 can be vapor deposited using the same opening of the mask plate, thereby being beneficial to the screening of the mask plate, having small screening pressure and improving the quality of the screening.

As illustrated by FIG. 3B, because the slope of the first sub-pixels 111 of the same row is low, upon the first sub-pixels 111 belonging to the same row displaying a straight line together, the fluctuation amplitude of the first sub-pixels of adjacent pixel groups is small due to the low slope (dashed line with dense dots in FIG. 3B), thus avoiding the situation that two straight lines generated by interlocking with straight lines displayed in adjacent rows due to large fluctuation amplitude are difficult to distinguish and are combined into one visually by human eyes. Therefore, the pixel arrangement structure can improve the visual resolution.

Figure 3C:
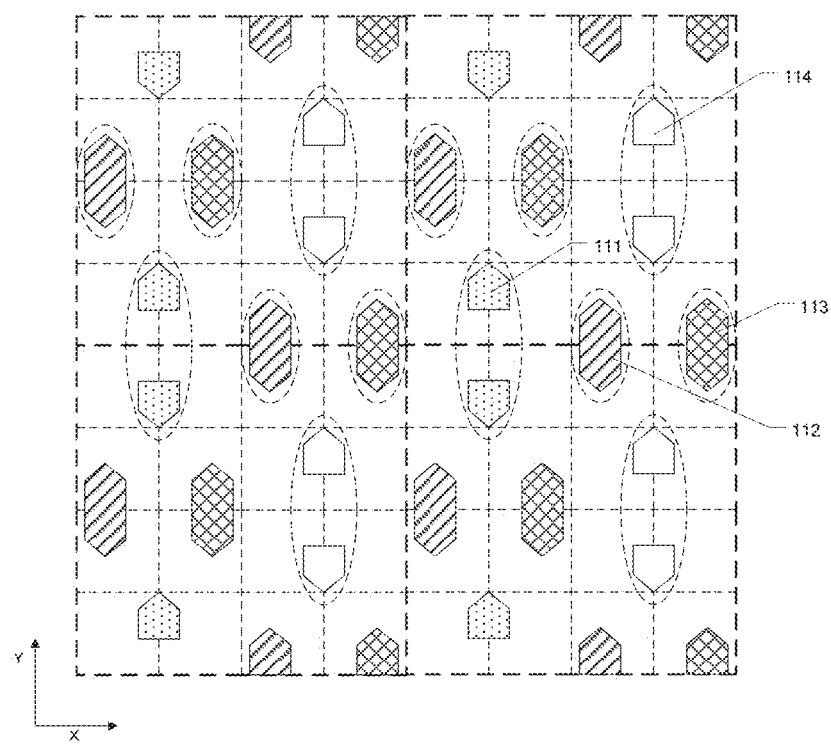
FIG. 3C is a schematic diagram of a pixel arrangement structure in a display substrate according to another embodiment of the present disclosure.

FIG. 3C illustrates a display substrate provided by one or more embodiments of the present disclosure. As illustrated by FIG. 3C, in each pixel group 01, the first sub-pixel 11 and the fourth sub-pixel 114 are sub-pixels of the same color, and can include, for example, two types of pixel groups, in which pairs of sub-pixels of the same color in one type of pixel group are first sub-pixels (e.g., green sub-pixels), and pairs of sub-pixels of the same color in another type of pixel group are fourth sub-pixels (e.g., white sub-pixels or yellow sub-pixels). The colors of the two sub-pixels arranged in pairs between the second sub-pixel and the third sub-pixel in the pixel group adjacent in the diagonal direction of each pixel group are different from the colors of the sub-pixels arranged in pairs between the second sub-pixel and the third sub-pixel in the pixel group.

Figure 4:
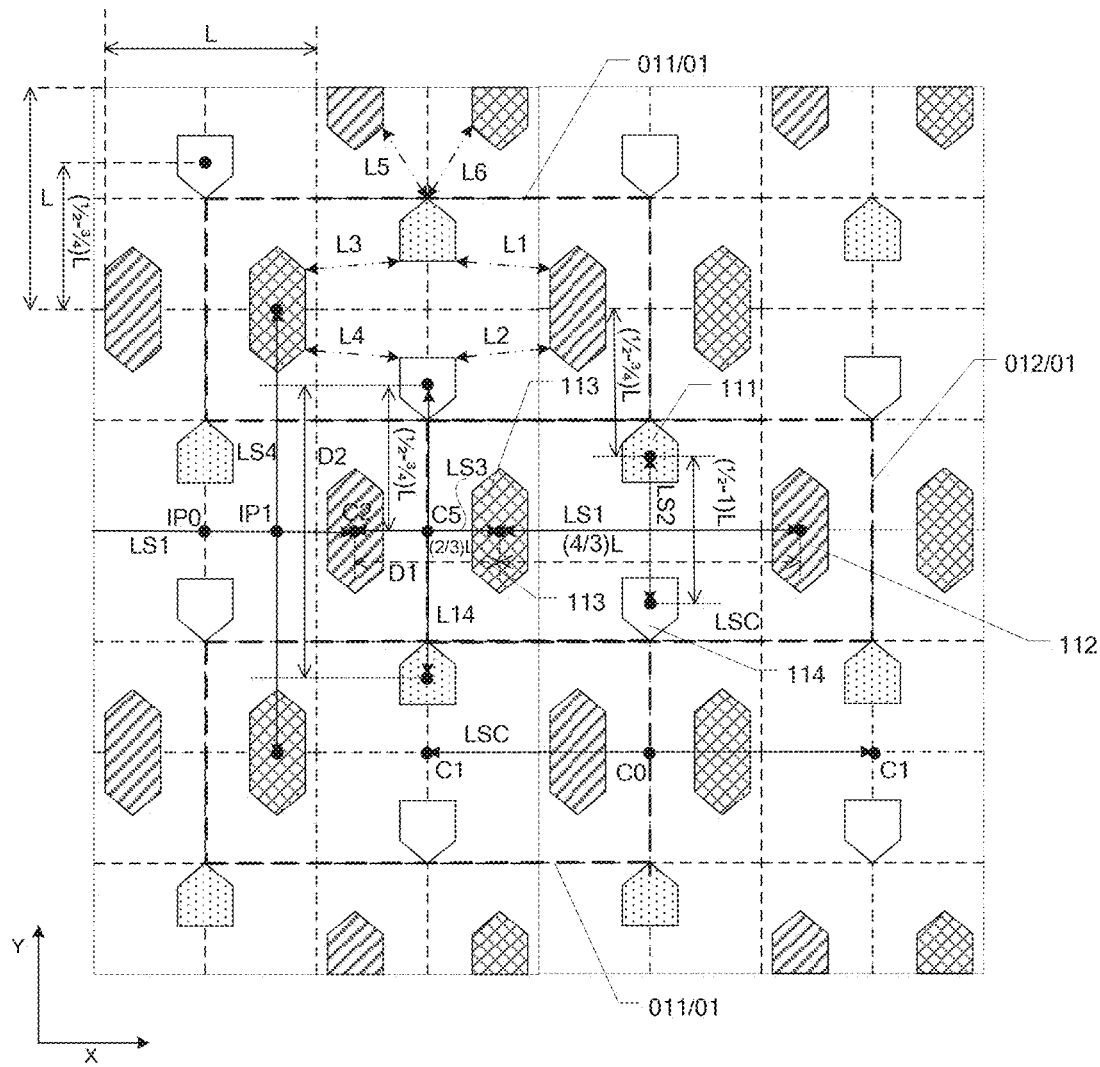
FIG. 4 is a schematic diagram of a pixel arrangement structure in a display substrate according to an embodiment of the present disclosure.

FIG. 4 illustrates a display substrate provided by one or more embodiments of the present disclosure. As illustrated by FIG. 4, the first line segment LS1 can extend in the first direction X, and a length D1 of a center connection line LS3 between adjacent second sub-pixels 112 and third sub-pixels 113 in two adjacent pixel groups 01 in the first direction X is less than a length of the first line segment LS1, so that pixels can be closely arranged. In FIG. 4, the length of the first line segment LS1 is 4/3 L, but is not limited thereto. For example, the length of the first line segment LS1 can range from 11/9 L to 13/9 L.

For example, in order to allow the tight arrangement of pixels and process conditions to be combined, the ratio of the length D1 of the center connection line LS3 between the center of the adjacent second sub-pixel 112 and the center of the third sub-pixel 113 in the two adjacent pixel groups 01 in the first direction to the length of the first line segment LS1 is less than or equal to 1/2. In FIG. 4, the length D1 is ⅔L, but it is not limited thereto. For example, the length D1 can range from ⅝ L to ⅞ L.

As illustrated by FIG. 4, in the pixel arrangement structure of the display substrate provided by one or more embodiments of the present disclosure, a plurality of pixel groups 01 are arranged in an array, a plurality of rows and a plurality of columns are included, for example, the pixel arrangement structure includes a plurality of first pixel groups 011 located in odd rows and a plurality of second pixel groups 012 located in even rows. For example, pixel groups of even rows and pixel groups of odd rows are arranged in a staggered way. The second line segment LS2 can extend in the second direction Y. For example, in order to realize pixel arrangement density in the column direction, in the adjacent odd row or in the adjacent even row, the length D2 of the center connection line L14 between the first sub-pixel 111 and the fourth sub-pixel 114 which are adjacent to each other in two adjacent ones of the plurality of pixel groups 01 in the second direction Y is greater than the length of the second line segment LS2. For example, in two adjacent ones of the odd rows or in two adjacent ones of the even rows, the ratio of the length D2 of the center connection line L14 between the adjacent first sub-pixel 111 and the fourth sub-pixel 114 in the adjacent two pixel groups 01 in the second direction Y to the length of the second line segment LS2 ranges from 1 to 3.

For example, in adjacent odd rows or in adjacent even rows, the length D2 of the center connection line L14 between the adjacent first sub-pixel 111 and the fourth sub-pixel 114 in the adjacent two pixel groups 01 in the second direction Y is greater than the length of the second line segment LS2.

Thus, a pixel structure in which 6 pixel groups are closely arranged around one pixel group can be formed. The odd row pixel groups and the even row pixel groups are staggered. For example, the odd row pixel groups and the even row pixel groups are offset in the first direction X by the length of half a pixel group in the first direction X, for example, the offset length is L, but is not limited thereto. For example, in adjacent odd rows or in adjacent even rows, the ratio of the length D2 of the center connection line between the adjacent first sub-pixel 111 and the fourth sub-pixel 114 in the adjacent two pixel groups 01 in the second direction Y to the length of the second line segment LS2 ranges 1 to 3.

As illustrated by FIG. 4, in the pixel arrangement structure of the display substrate provided by one or more embodiments of the present disclosure, an extension line of the second line segment LS2 of each pixel group 01 passes through a midpoint C0 of a center connection line LSC between two pixel groups 01 adjacent to the pixel group 01 in the second direction Y and located in the same row. The center of each pixel group 01 is C1, and the connection line between the centers C1 of two adjacent pixel groups 01 is the center connection line LSC. For example, the center C1 of the pixel group 01 may be the intersection point of the first line segment LS1 and the second line segment LS2.

For example, the extension line of the second line segment LS2 of each first pixel group 011 passes through the center C5 of the center connection line LS3 between the adjacent third sub-pixel 113 and the second sub-pixel 112 of the two second pixel groups 012 adjacent to the first pixel group 011 and located in the same row. For example, the center C5 and the center C0 can be the same point.

As illustrated by FIG. 4, in the display substrate provided by one or more embodiments of the present disclosure, in two adjacent odd rows or two adjacent even rows, an intersection point IP1 of the center connection line LS4 between two third sub-pixels 113 in two adjacent pixel groups 01 (two adjacent first pixel groups 011 or two adjacent second pixel groups 012) arranged in the second direction Y and the first line segment LS1 in one pixel group 01 located between the two third sub-pixels 113 is located between a center IP0 of the first line segment LS1 and a center C2 of the second sub-pixel 112 of the one pixel group 01. For example, the center IP0 of the first line segment LS1 can be the center C1 of the pixel group 01. For example, the intersection point IP1 is located at the midpoint of the connection line between the center IP0 of the first line segment LS1 and the center C2 of the second sub-pixel 112.

For example, in adjacent odd rows, the intersection point IP1 of the center connection line LS4 between the two third sub-pixels 113 of the adjacent first pixel groups 011 located in the same column and the first line segment LS1 of the second pixel group 012 adjacent to the third sub-pixel 113 is located at a position between the intersection point IP0 of the first line segment LS1 and the second line segment LS2 of the second pixel group 012 and the center C2 of the second sub-pixel 112. The third sub-pixel 113 above-mentioned can also be replaced by the second sub-pixel 112.

For example, in adjacent odd rows or adjacent even rows, the intersection point of the center connection line between two second sub-pixels 112 in two adjacent pixel groups 01 (two adjacent first pixel groups 011 or two adjacent second pixel groups 012) arranged in the second direction Y and the first line segment LS1 in the pixel group 01 located between the two second sub-pixels 112 is located between the center IP0 of the first line segment LS1 and the center C3 of the third sub-pixel 113. For example, the intersection point is located at the midpoint of the connection line between the center IP0 of the first line segment LS1 and the center C3 of the third sub-pixel 113.

For example, the first spacer 0101 is disposed between adjacent pixel groups of different rows. For example, the second spacer 0102 is disposed between adjacent pixel groups of different rows.

As illustrated by FIG. 4, in the pixel arrangement structure provided by one or more embodiments of the present disclosure, in the same pixel group, the closest distance between the second sub-pixel 112 and the first sub-pixel 111 is L1, the closest distance between the second sub-pixel 112 and the fourth sub-pixel 114 is L2, the closest distance between the third sub-pixel 113 and the first sub-pixel 111 is L3, the closest distance between the third sub-pixel 113 and the fourth sub-pixel 114 is L4, L1=L2=L3=L4.

As illustrated by FIG. 4, in the pixel arrangement structure provided by one or more embodiments of the present disclosure, the closest distance between the second sub-pixel 112 and one of the first sub-pixel 111 and the fourth sub-pixel 114 is L5, the closet distance between the third sub-pixel 113 and one of the first sub-pixel 111 and the fourth sub-pixel 114 is L6, the second sub-pixel 112 and the third sub-pixel 113 are in a pixel group being adjacent to the first sub-pixel or the fourth sub-pixel in the second direction and are not in the same row with the first sub-pixel or the fourth sub-pixel, and L5=L6.

For example, in an embodiment, L1=L2=L3=L4=L5=L6.

For example, with respect to L1. L2, L3, L4, L5, and L6, the marks about the minimum process spacing d in FIGS. 7A and 7B can also be referred to. Each nearest distance is the minimum distance between two sub-pixels. For example, L1, L2, L3, L4, L5, and L6 can be made as close as possible to the minimum process spacing d during actual fabrication. For example, the closest distance is the distance between the closest two points on the outer edge of the two sub-pixels.

As illustrated by FIG. 4, in the pixel arrangement structure provided by one or more embodiments of the present disclosure, the opposite sides of adjacent pixies are approximately parallel or have an included angle less than 45 degrees, and the adjacent sub-pixels include any two adjacent ones of the first sub-pixel 111, the second sub-pixel 112, the third sub-pixel 113, and the fourth sub-pixel 114.

Figure 5A:
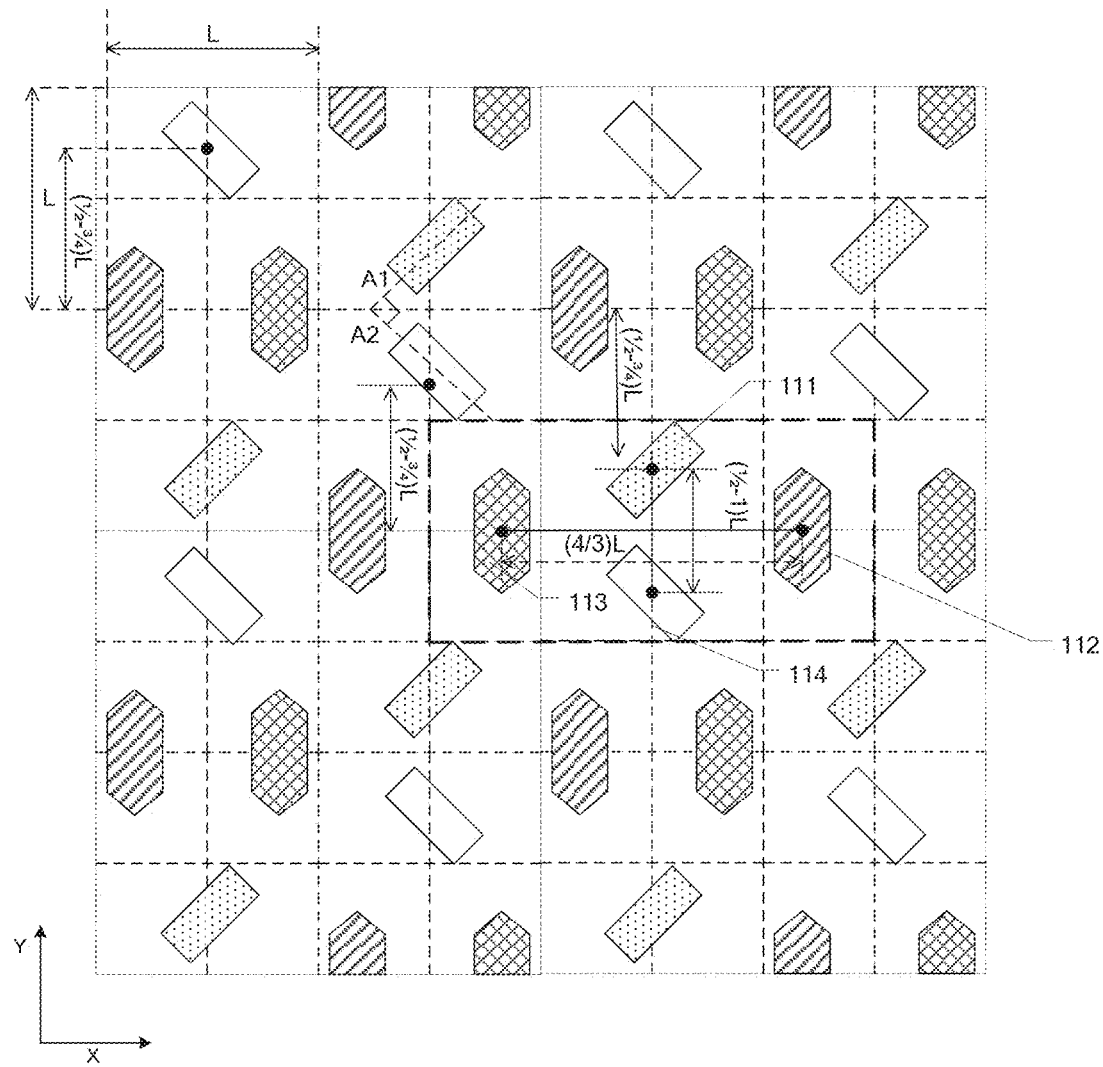
FIG. 5A is a schematic diagram of a pixel arrangement structure in a display substrate according to another embodiment of the present disclosure.

As illustrated by FIG. 5A, in the pixel arrangement structure of the display substrate provided by one or more embodiments of the present disclosure, the first sub-pixel 111 and the fourth sub-pixel 114 are both strip-shaped, and the extension direction A1 of the first sub-pixel 111 does not coincide with the extension direction A2 of the fourth sub-pixel 114. For example, the extension direction A1 of the first sub-pixel 111 intersects or has an included angle with the extension direction A2 of the fourth sub-pixel 114. For example, in each pixel group, the first sub-pixel 111 and the fourth sub-pixel 114 are arranged with the first direction X as an axis of symmetry and inclined at a certain angle. For example, the included angle between the inclination angle and the first direction X ranges from 30 to 50 degrees, and further for example, the included angle is 45 degrees, but is not limited thereto. For example, the extension direction A1 of the first sub-pixel 111 can be the long axis direction of the first sub-pixel 111, but is not limited thereto. For example, the extension direction A2 of the fourth sub-pixel 114 can be the long axis direction of the fourth sub-pixel 114, but is not limited thereto.

As illustrated by FIG. 5A, in each pixel group 01 of the pixel arrangement structure provided by one or more embodiments of the present disclosure, the first sub-pixel 111 and the fourth sub-pixel 114 are symmetrically arranged with respect to the first line segment LS1. For example, in each pixel group 01, the first sub-pixel 111 and the fourth sub-pixel 114 are asymmetrically arranged with respect to the second line segment LS2.

For example, the second sub-pixel 112 and the third sub-pixel 113 are symmetrically arranged with respect to the second line segment LS2, but is not limited thereto.

For example, in this embodiment of the present disclosure, the strip shape refers to a shape in which a length in one direction is greater than a length in another direction, or a dimension in one direction is greater than a dimension in other directions. The strip shape is not limited to a rectangle, and can be other shapes, for example, may be a long hexagonal shape, an oblong shape, a trapezoid shape, or other shapes. In the embodiments of the present disclosure, the shape of each sub-pixel is not limited to a regular shape, and can be an irregular shape.

For example, the included angle between the extension direction A1 of the first sub-pixel 111 and the extension direction A2 of the fourth sub-pixel 114 ranges from 70 degrees to 100 degrees, further, the included angle can range from 80 degrees to 95 degrees, further, the included angle can be 90 degrees (a right angle), so that the first sub-pixel 111 and the fourth sub-pixel 114 forming a larger area can be utilized to improve the light emitting area and is beneficial to the screening of the mask plate during fabricating the mask plate of the light emitting layer pattern. For example, in a case where the included angle is a right angle, deviations of up and down several degrees can be allowed. For example, it can deviate from 90 degrees by 5 degrees.

Figure 5B:
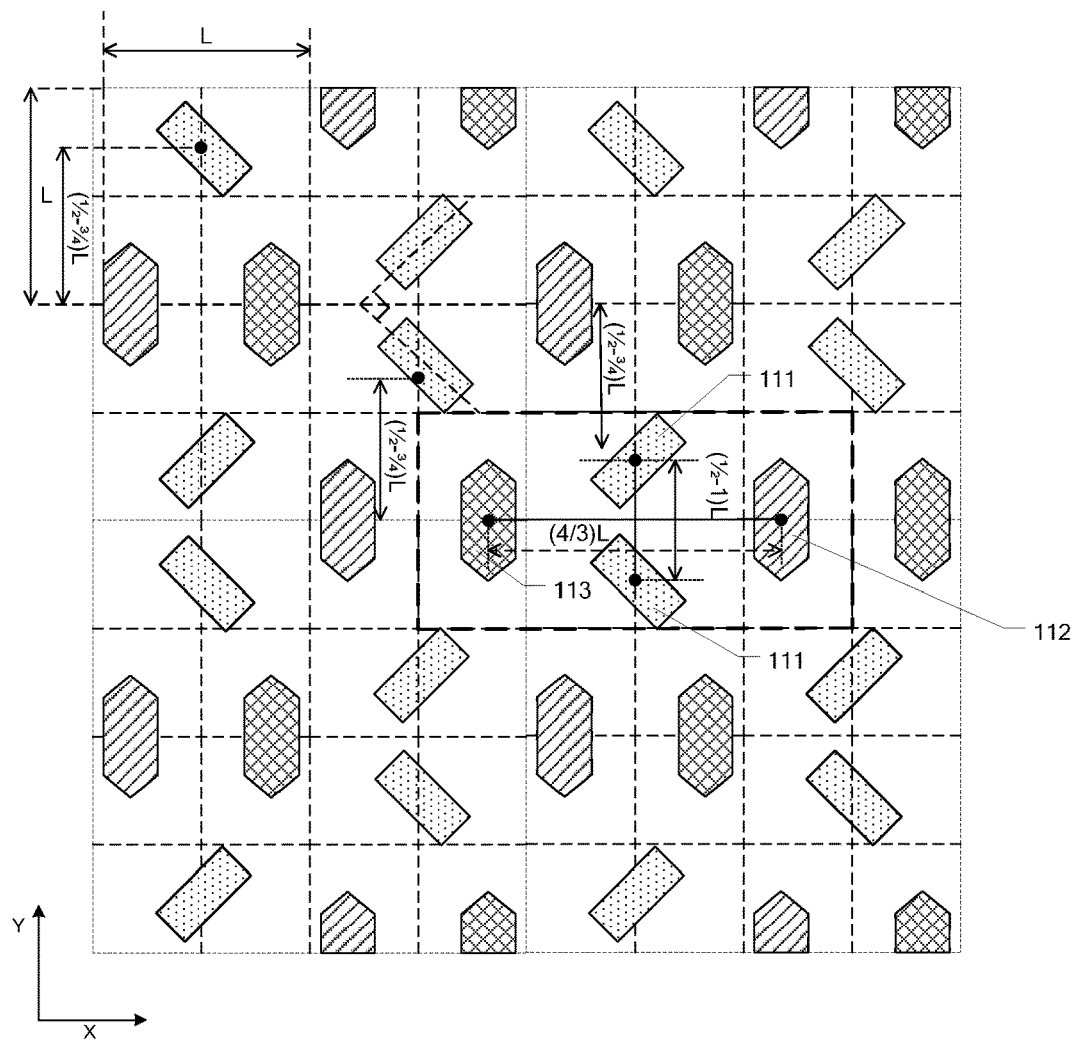
FIG. 5B is a schematic diagram of a pixel arrangement structure in a display substrate according to another embodiment of the present disclosure.

FIG. 5B illustrates a display substrate provided by one or more embodiments of the present disclosure, in a pixel arrangement structure of the display substrate, an included angle between an extension direction A1 of the first sub-pixel 111 and an extension direction A2 of the fourth sub-pixel 114 is a right angle, and in the same pixel group 01, the first sub-pixel 111 and the fourth sub-pixel 114 are sub-pixels of the same color.

Figure 6:
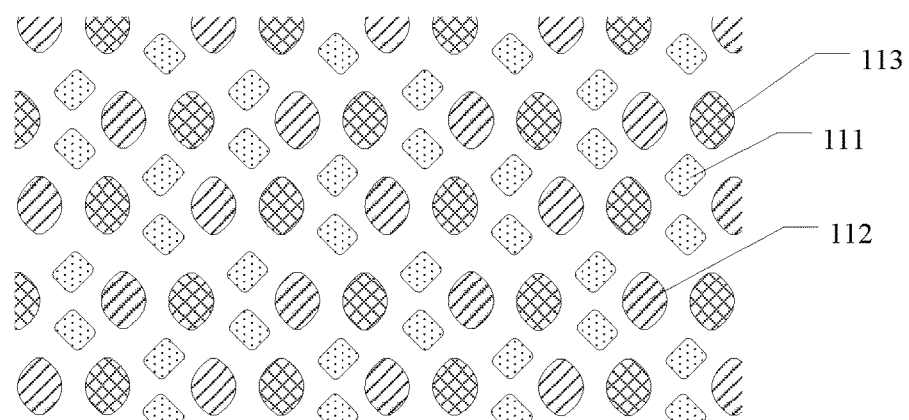
FIG. 6 is a schematic diagram of a pixel arrangement structure in a display substrate according to an embodiment of the present disclosure.

FIG. 6 illustrates a display substrate provided by one or more embodiments of the present disclosure. As illustrated by FIG. 6, the second sub-pixel 112 and the third sub-pixel 113 can be rhombus or approximately rhombus. Approximate rhombus includes, for example, rounded rhombus, chamfered rhombus, etc., but is not limited thereto. The sub-pixel shape of rhombus or approximately rhombus shape is more favorable for pixel dense arrangement. For example, the first sub-pixel 111 can be relatively symmetrical around the third sub-pixel 113 and the second sub-pixel 112, with the long sides of the first sub-pixel 111 all facing the second sub-pixel 112 and the short sides all facing the third sub-pixel 113 to ensure the uniformity of pixel arrangement to the greatest extent. The arrangement of the first sub-pixels 111 is more uniform, which can improve the color edge to a certain extent, is conducive to the realization of high PPI, and can improve the pixel aperture ratio as high as possible.

The shape of each sub-pixel is not limited to the above, and the shapes of the sub-pixels can be adjusted as required. Maximizing the area is the main principle for determining the shape of sub-pixels.

In order to avoid color mixing, the spacing between different color sub-pixels should be greater than the minimum process spacing d of the patterning process, and some special process symmetry requirements should be considered. For example, the FMM screening requires symmetrical opening patterns and distribution, and the shapes of the first sub-pixel and the fourth sub-pixel can be symmetrical pentagons with right-angle bottom corners respectively (as illustrated by FIG. 2E). It can be seen that the spacing between the second and third sub-pixel of adjacent pixel groups using symmetrically shaped sub-pixels are significantly larger than other spacing between different color sub-pixels (the minimum process spacing d), i.e., there is still usable area in design. Under the condition that FMM screening technology allows or adopts other symmetry insensitive (e.g. CF) processes, asymmetrical sub-pixel shapes can be adopted to realize maximum sub-pixel area.

Figure 7A:
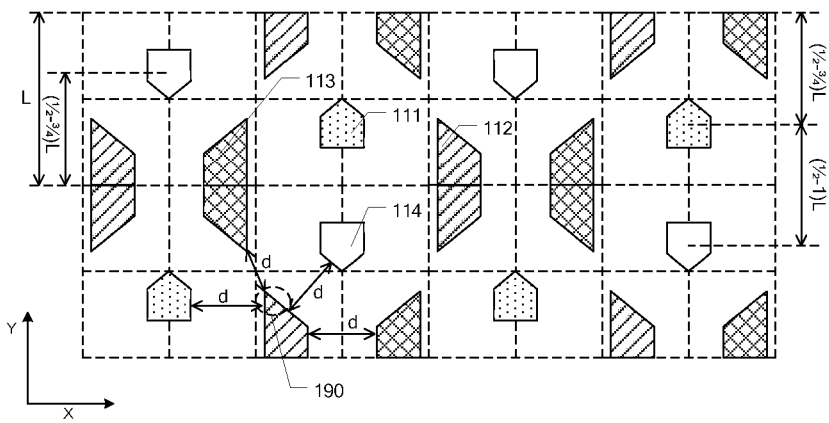
FIG. 7A is a schematic diagram of a pixel arrangement structure in a display substrate according to another embodiment of the present disclosure.
Figure 7B:
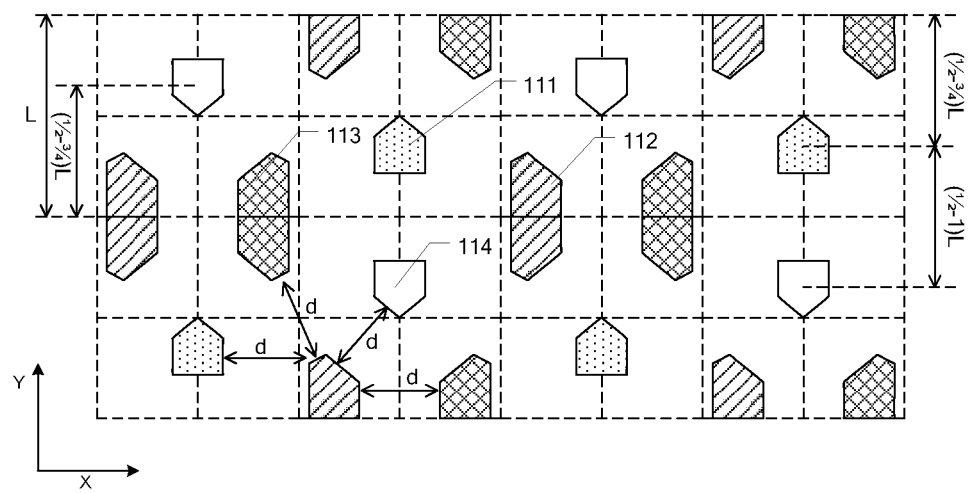
FIG. 7B is a schematic diagram of a pixel arrangement structure in a display substrate according to another embodiment of the present disclosure.

FIGS. 7A and 7B illustrate pixel arrangement structures in a display substrate provided by one or more embodiments of the present disclosure. As illustrated by FIGS. 7A and 7B, under the condition that asymmetric sub-pixel shapes are allowed to be adopted, according to the minimum process spacing d of different patterning processes, the shapes of the second sub-pixel 112 and the third sub-pixel 113 can be right-angle trapezoids or right-angle trapezoids with acute angles cut off, so as to maximize the area.

As illustrated by FIG. 7A, because the shapes of the second sub-pixel 112 and the third sub-pixel 113 are both right-angle trapezoids, compared to the case where the shapes of the second sub-pixel 112 and the third sub-pixel 113 are both hexagonal (a hexagonal shape formed by combining two pentagons with symmetrical right-angle bottom angles), the acute angle portions 190 of the second sub-pixel 112 and the third sub-pixel 113 can further improve the areas of the second sub-pixel 112 and the third sub-pixel 113, and thus further improve the space utilization rate in the pixel group. The pixel arrangement structure can improve the space utilization rate in the pixel group.

As illustrated by FIG. 7B, the shapes of the second sub-pixel 112 and the third sub-pixel 113 are both isosceles trapezoids with acute angles cut off. Therefore, when the process accuracy is constant, that is, when the distances between the first sub-pixel 111 and the second sub-pixel 112 and between the first sub-pixel 111 and the third sub-pixel 113 are constant, the areas of the second sub-pixel 112 and the third sub-pixel 113 are increased, thereby improving the utilization rate of the space within the pixel group.

In the pixel arrangement structure in the display substrate provided by one or more embodiments of the present disclosure, the shapes of the second sub-pixel 112 and the third sub-pixel 113 include at least one of isosceles trapezoid, hexagon and rhombus, and the shape of the second sub-pixel 112 includes at least one of pentagon, rectangle and approximate rectangle. The approximate rectangle includes, for example, but is not limited to, a rounded rectangle.

Figure 8:
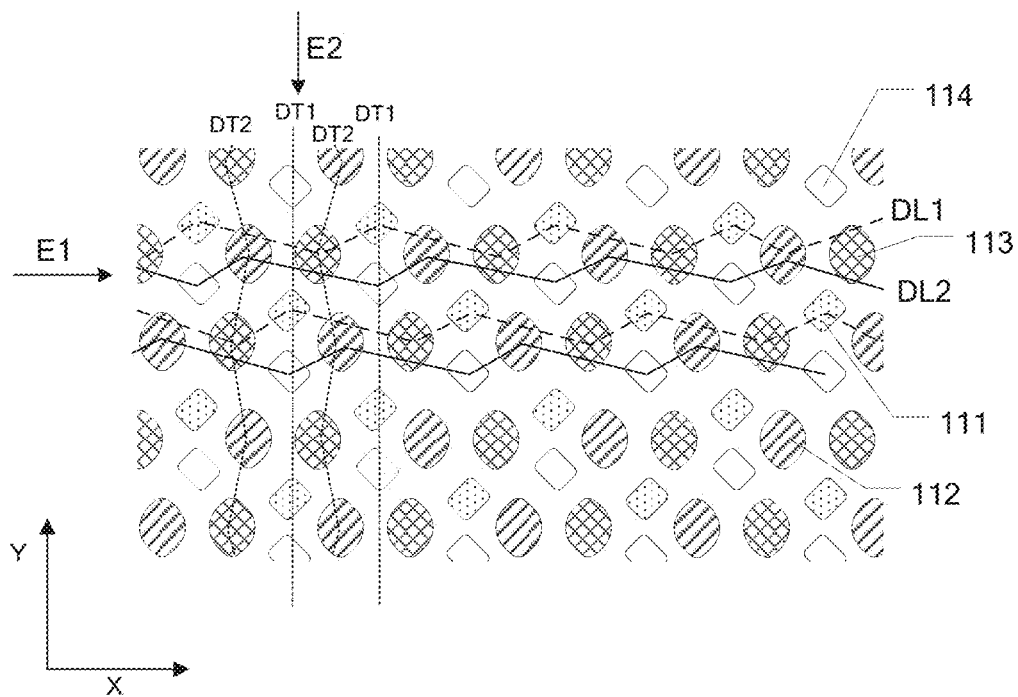
FIG. 8 is a schematic diagram of a pixel arrangement structure, drive lines and data lines of a display substrate according to another embodiment of the present disclosure.

FIG. 8 illustrates a display substrate provided by one or more embodiments of the present disclosure. As illustrated by FIG. 8, in the same row of pixel groups, the third sub-pixel 113 and the first sub-pixel 111 can be driven by the first drive line DL1, and the second sub-pixel 112 and the fourth sub-pixel 114 can be driven by the second drive line DL2. The first drive line DL1 extends in the direction E1 and the second drive line DL2 extends in the direction E1. For example, the direction E1 is parallel to the first direction X.

As illustrated by FIG. 8, the first sub-pixel 111 and the fourth sub-pixel 114 in the odd column pixel group can use the first data line DT1 to input data signals, and the second sub-pixel 112 and the third sub-pixel 113 located between the adjacent two first data lines DT1 can use the second data line DT2 to input data signals. For example, the data signal includes a voltage and/or a current. The first data line DT1 extends in the direction E2, and the second data line DT2 also extends in the direction E2, which is parallel to the second direction Y.

Figure 9:
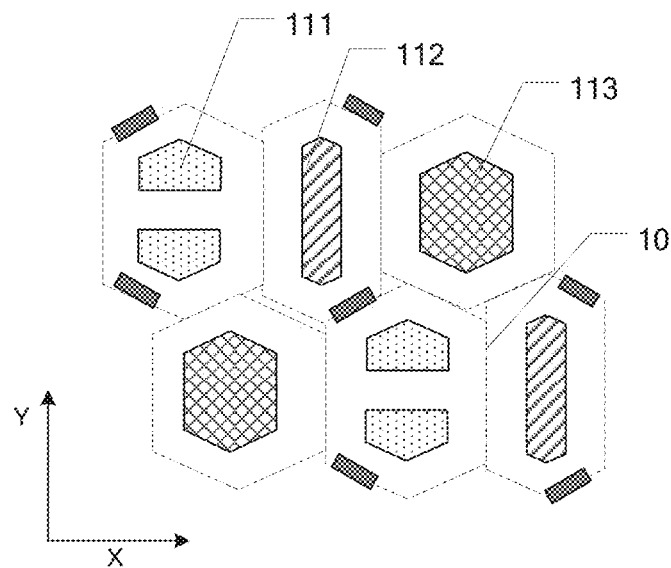
FIG. 9 shows a schematic view of a display substrate.

FIG. 9 illustrates a schematic diagram of a display substrate. In the display substrate, the widths of the sub-pixels in the first direction X are different. Because the widths of the sub-pixels are different, it is easy to produce color shift when viewing at different viewing angles.

Figure 10:
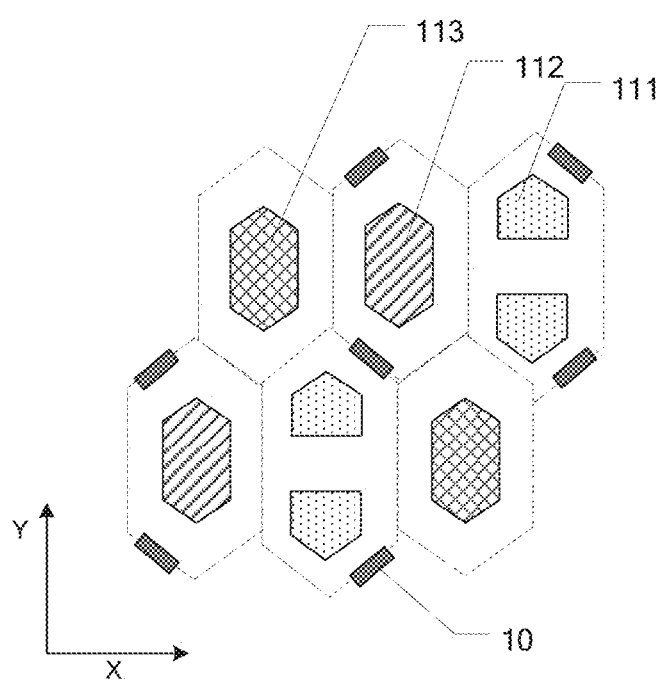
FIG. 10 shows a schematic diagram of a display substrate according to one or more embodiments of the present disclosure.

FIG. 10 illustrates a schematic diagram of a display substrate provided by one or more embodiments of the present disclosure. In the first direction X, the widths of the first sub-pixel 111, the second sub-pixel 112, the third sub-pixel 113, and the fourth sub-pixel 114 are the same in the first direction X. Therefore, the viewing angle color shift when viewing at different viewing angles can be reduced.

For example, one pixel group includes two pixel units, for example, the first sub-pixel 111 and the second sub-pixel 112 form a pixel unit, the third sub-pixel 113 and the fourth sub-pixel 114 form the other pixel unit. Each pixel unit can share the third sub-pixel 113 or the fourth sub-pixel 114 adjacent thereto for full color display. The display is realized by sub-pixel sharing. The division of pixel cells is not limited to the above description. The pixel unit herein can be referred to as a virtual pixel. The division of virtual pixels is related to the driving mode. The specific division mode of the virtual pixels can be determined according to the actual driving mode, and the present disclosure is not specifically limited to this.

Figure 11:
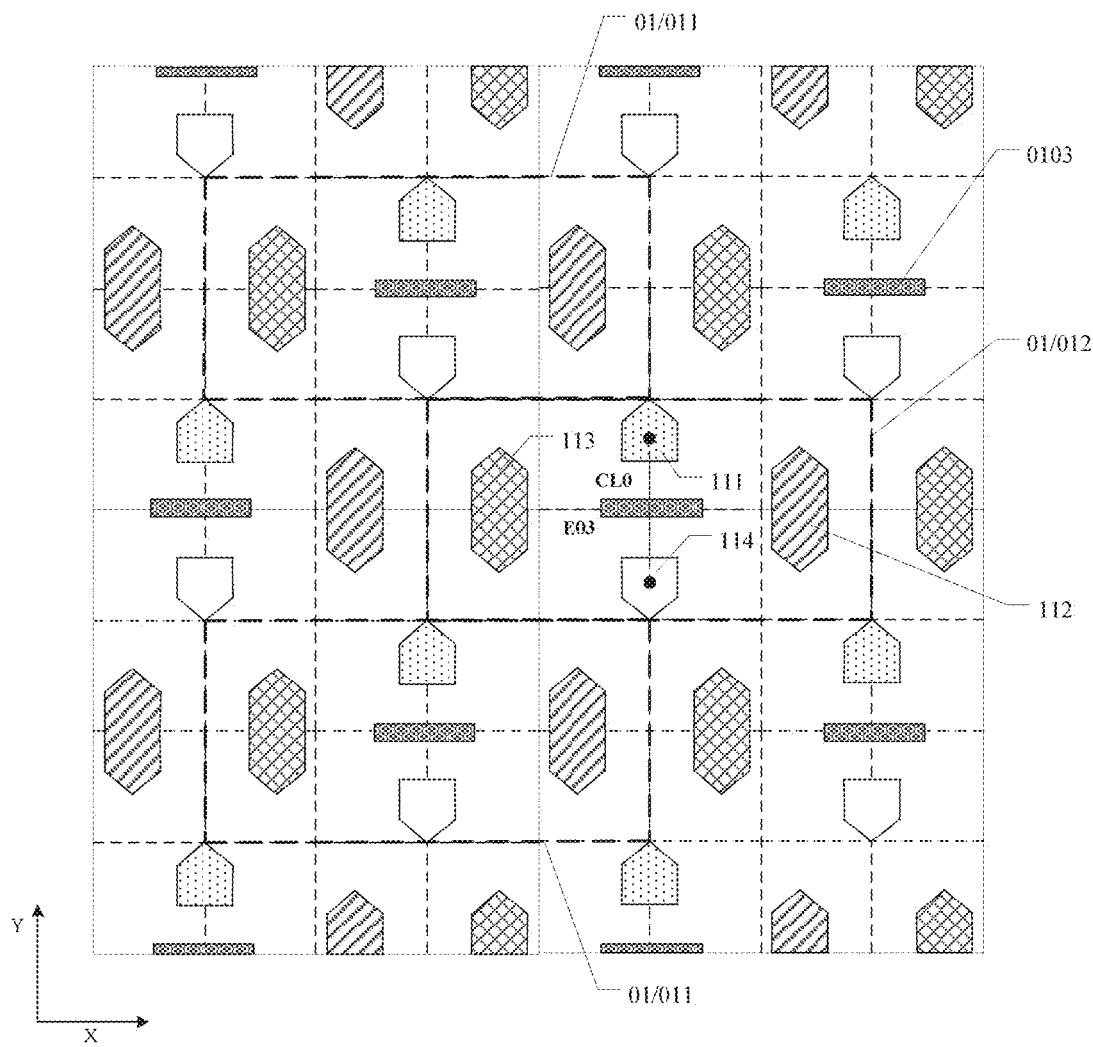
FIG. 11 shows a schematic diagram of a display substrate according to one or more embodiments of the present disclosure.

FIG. 11 illustrates a schematic diagram of a display substrate provided by one or more embodiments of the present disclosure. As illustrated by FIG. 11, the display substrate includes a third spacer 0103 located between the first sub-pixel 111 and the fourth sub-pixel 114 in the pixel group 01. For example, the first sub-pixel 111 and the fourth sub-pixel 114 can be both green sub-pixels, but are not limited thereto.

At the side view angle, the light emission of each sub-pixel is not shielded by the third spacer 0103, thereby improving the color asymmetry phenomenon at the left and right view angles when displaying a white picture to a certain extent, and improving the image quality and the display effect. By arranging the third spacer 0103, the problem of inconsistent light shielding for each sub-pixel in the left and right directions is basically eliminated, and further the phenomenon of color asymmetry at left and right angles can be eliminated to a great extent. For the up and down directions, because the third spacer only shields the first sub-pixel and the fourth sub-pixel, even if the angle color shift is generated due to the shielding for the first sub-pixel and the fourth sub-pixel, the phenomenon of angle color shift does not exist because the shielding for the first sub-pixel and the fourth sub-pixel are consistent under the same angle in the up and down directions. For example, by adjusting the size and thickness of the third spacer 0103, the shielding degree of the third spacer 0103 to the first sub-pixel 111 and the fourth sub-pixel 114 can be adjusted, thereby adjusting the angle color shift degree in the up and down directions.

As illustrated by FIG. 11, the extension direction E03 of the third spacer 0103 is perpendicular to the connection line CL0 between the center C1 of the first sub-pixel 111 and the center C4 of the fourth sub-pixel 114, but is not limited thereto.

As illustrated by FIG. 11, the length of the third spacer 0103 in the first direction X is greater than the length of at least one of the first sub-pixel 111 and the fourth sub-pixel 114 in the first direction X.

As illustrated by FIG. 11, the shapes of the first sub-pixel 111 and the fourth sub-pixel 114 are both pentagon. The pentagon includes a group of parallel opposite sides and a vertical side, and the vertical side is perpendicular to the group of parallel opposite sides. The third spacer 0103 is parallel to the vertical side of the pentagon.

Figure 12:
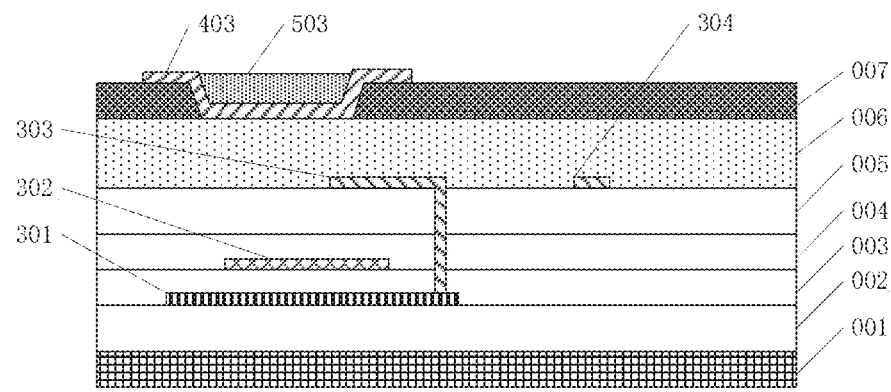
FIG. 12 is a cross-sectional view of a display substrate according to an embodiment of the present disclosure.

FIG. 12 is a cross-sectional view of a display substrate provided by an embodiment of the present disclosure. As illustrated by FIG. 12, the structure includes a base substrate 001, and a buffer layer 002, a first gate insulation layer 003, a second gate insulation layer 004, an interlayer dielectric layer 005, a planarization layer 006, and a pixel defining layer 007 sequentially located on the base substrate 001. As can be seen from FIG. 12, below the sub-pixel, there is a thin film transistor structure including a gate electrode 302, an active layer 301, and a drain electrode 303. The thin film transistor can be one of the thin film transistors in a pixel drive circuit, and the connection relationship with other components can be set according to the specific pixel circuit arrangement, which is not illustrated by detail herein. In addition, a signal line 304 can also be included at a position on the same layer as the drain electrode 303, and the signal line 304 can also be used as a signal line of a specific function according to different pixel circuit arrangements, for example, a data line or a gate line, etc. As can be seen from FIG. 12, the pixel defining layer 007 can include openings defining sub-pixels. The anode 403 of the sub-pixel and the light emitting layer 503 of the third sub-pixel are located in the openings of the pixel defining layer 007. It should be noted that the structure of the display substrate is not limited to that illustrated by FIG. 12.

For example, the anode 403 and the light emitting layer 503 are in contact with each other, so that the light emitting layer can be driven to emit light at a portion in contact with each other, and therefore, the portion in contact with each other between the anode 403 and the light emitting layer 503 is an effective portion in which the sub-pixel can emit light. Here, the anode 403 serves as a pixel electrode so that different data voltages can be applied to different sub-pixels. However, in the embodiments according to the present disclosure, the electrode used as the pixel electrode of the sub-pixel is not limited to the anode, and the cathode of the light emitting diode may also be used as the pixel electrode. Therefore, in the embodiments of the present disclosure, the shape of the sub-pixel can refer to the shape of a portion where the pixel electrode and the light emitting layer contact each other. For example, for each sub-pixel, the area of the pixel electrode can be slightly larger than the area of the light emitting layer, or the area of the light emitting layer can be slightly larger than the area of the pixel electrode, and the embodiments of the present disclosure is not particularly limited to this. For example, the light emitting layer here can include the electroluminescent layer itself and other function layers located on both sides of the electroluminescent layer, for example, a hole injection layer, a hole transport layer, an electron injection layer, an electron transport layer, and the like. In some embodiments, the shape of a pixel can also be defined by a pixel defining layer. For example, a lower electrode (e.g., an anode) for a light emitting diode can be disposed below a pixel defining layer including an opening for defining a pixel that exposes a portion of the lower electrode. When the light emitting layer is formed in the opening in the pixel defining layer described above, the light emitting layer contacts the lower electrode so that the light emitting layer can be driven to emit light at this portion. Therefore, in this case, the opening of the pixel defining layer defines the shape of the sub-pixel.

For example, the pixel circuit includes at least one transistor including a gate, an active layer, and source and drain electrodes. In one example, the signal line is electrically connected to the source electrode or drain electrode of the corresponding transistor through a via hole penetrating through the insulation layer below it. In one example, the active layer of the transistor is formed of a polysilicon layer. On both sides of the channel region of the active layer, the polysilicon layer is conductive to form the source and drain electrodes. For example, the signal line is electrically connected to the polysilicon source or drain electrodes formed by conducting through a via hole. For example, the transistor is a top gate transistor, and a via hole for electrically connecting the signal line to the source or drain electrodes of the corresponding transistor passes through the gate metal layer and the data metal layer, and a portion of the metal pattern of the gate metal layer and the data metal layer can be used as a relay connector for electrically connecting the via hole, but embodiments of the present disclosure are not limited thereto.

For example, the shapes of the various sub-pixels described in the embodiments of the present disclosure are all approximate shapes. When forming the light emitting layer or various electrode layers, it is not guaranteed that the edges of the sub-pixels are strictly straight lines and the corners are strictly angular. For example, the light emitting layer can be formed by a mask vapor deposition process, and therefore, its corners can be rounded. In some cases, metal etching can have a draft angle, so when forming a light emitting layer of a sub-pixel by vapor deposition, one angle of the light emitting layer can be removed. For example, in the embodiments of the present disclosure, the shapes of each sub-pixel are all rounded corners.

For example, as illustrated by FIG. 2A, in a pixel group, the first sub-pixel 111 and the second sub-pixel 112 are sub-pixels of different colors, the first sub-pixel 111 and the second sub-pixel 112 form a pixel P, the third sub-pixel 113 and the fourth sub-pixel 114 are sub-pixels of different colors, the third sub-pixel 113 and the fourth sub-pixel 114 form a pixel P, and sub-pixels of other surrounding pixels need to be borrowed for color display when displaying an image. For example, the first sub-pixel 111 and the fourth sub-pixel 114 are green sub-pixels, the second sub-pixel 112 is red sub-pixel, and the third sub-pixel 113 is blue sub-pixel. For example, a red sub-pixel and a green sub-pixel form a pixel, and a blue sub-pixel and a green sub-pixel form a pixel. The pixel P here only includes sub-pixels of two colors. When displaying an image, it is necessary to use sub-pixels of other surrounding pixels for color display. Therefore, the pixel P here can also be referred to as a virtual pixel. In a case of high resolution, green sub-pixels play a decisive role in the perceived luminance center position of each pixel. For example, the luminance center of a pixel formed by one red sub-pixel and one green sub-pixel is located between the red sub-pixel and the green sub-pixel and closer to the green sub-pixel, and the luminance center of a pixel formed by one blue sub-pixel and one green sub-pixel is located between the blue sub-pixel and the green sub-pixel and closer to the green sub-pixel.

For example, as illustrated by FIG. 2A, the shapes of the second sub-pixel and the third sub-pixel are both hexagon, and the three groups of opposite sides of the hexagon are all parallel; the shapes of the first sub-pixel and the fourth sub-pixel are both pentagon, the pentagon includes a group of parallel opposite sides and a vertical side, and the vertical side is vertical to the group of parallel opposite sides; the vertical edges of the first sub-pixel and the fourth sub-pixel are adjacently arranged; a group of longer parallel opposite sides in the second sub-pixel, a group of long parallel opposite sides in the third sub-pixel, a group of parallel opposite sides in the first sub-pixel and a group of parallel opposite sides in the fourth sub-pixel are parallel.

When designing the pixel arrangement structure, the sub-pixels are generally designed into regular shapes, such as hexagons, pentagons, trapezoids or other shapes. When designing, the center of the sub-pixel can be the geometric center of the above regular shape. However, in the actual manufacturing process, the shape of the formed sub-pixel will generally deviate from the regular shape of the above design. For example, the corners of the above regular shape may become rounded corners, so the shape of the sub-pixel can be rounded corners. In addition, the shape of the actually manufactured sub-pixel may also have other changes from the designed shape. For example, the shape of a sub-pixel designed as a hexagon may become approximately oval in the actual manufacturing process. Therefore, the center of the sub-pixel may not be the strict geometric center of the irregular shape of the formed sub-pixel. In the embodiments of the present disclosure, the center of the sub-pixel can have a certain offset from the geometric center of the shape of the sub-pixel. The center of a sub-pixel refers to any point in an area bounded by a specific point on a radiation line segment starting from the geometric center of the sub-pixel to each point on the edge of the sub-pixel, and the specific point on the radiation line segment is ⅓ of the length of the radiation line segment from the geometric center. The definition of sub-pixel center is applicable to the center of sub-pixel shape with regular shape as well as the center of sub-pixel with irregular shape.

As mentioned above, due to various manufacturing errors, the shapes of the actually manufactured sub-pixels may deviate from the designed shapes of the sub-pixels. Therefore, in the present disclosure, there may be certain errors regarding the position of the sub-pixel center and the relationships between the sub-pixel center and the positions of other objects. For example, if the lines between the sub-pixel centers or the lines passing through the sub-pixel centers satisfy other corresponding restrictions (e.g., the extension direction), the lines need only pass through the area enclosed by the centers of the above-mentioned radiation line segments. Further for example, the center of the sub-pixel is located on a certain line, which refers to that the line passes through the area enclosed by the center of the above-mentioned radiation line segment.

In addition, although the shapes of each sub-pixel in the drawings include an angle strictly formed by two line segments, in some embodiments, shapes of each sub-pixel can be a rounded corner pattern. That is, on the basis of the above various graphic shapes, the corners of each sub-pixel are rounded. For example, upon the light emitting layer being evaporated through a mask, the corner portion of the light emitting layer may naturally form a rounded shape.

At least one embodiment of the present disclosure provides a display device including any of the above display substrates. Therefore, the color shift of different viewing angles can be improved, and the display quality can be improved. When the display device adopts the display panel with the pixel arrangement structure provided by the embodiments of the present disclosure, the resolution of the display device can be further improved, and a display device with real high resolution can be further provided. In addition, because the pixel arrangement structure provided by the embodiments of the present disclosure can have better symmetry, further, the uniformity of pixel distribution can be improved, and the display effect of the display device can be improved.

For example, in some examples, the display device can be any product or component with display function such as a smart phone, a tablet computer, a television, a display, a notebook computer, a digital photo frame, a navigator, etc.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

The invention claimed is:

1. A display substrate, comprising: a first sub-pixel, a second sub-pixel and a first spacer;
    wherein a connection line between a center of the first sub-pixel and a center of the second sub-pixel is a center connection line, the center connection line is not perpendicular to a first direction, and the first direction is at least one selected from the group consisting of a row direction and a column direction;
    the first spacer is between the first sub-pixel and the second sub-pixel, and an extension direction of the first spacer between the first sub-pixel and the second sub-pixel is not perpendicular to the first direction,
    wherein the display substrate comprises a plurality of pixel groups, each of the plurality of pixel groups comprises one first sub-pixel, one second sub-pixel, one third sub-pixel and one fourth sub-pixel; and the first spacer is between the first sub-pixel and the second sub-pixel which belong to different ones of the plurality of pixel groups,
    the display substrate further comprises: a second spacer, wherein the second spacer is between two adjacent ones of the plurality of pixel groups, and the second spacer is between the fourth sub-pixel and the second sub-pixel which belong to different ones of the plurality of pixel groups, or between the fourth sub-pixel and the third sub-pixel which belong to different ones of the plurality of pixel groups; an extension direction of the second spacer between the fourth sub-pixel and the second sub-pixel or between the fourth sub-pixel and the third sub-pixel is not perpendicular to the first direction.

2. The display substrate according to claim 1, wherein the extension direction of the first spacer has an included angle with the first direction, and a range of the included angle is 40°-50° or 130°-140°.

3. The display substrate according to claim 2, wherein the included angle is 45° or 135°.

4. The display substrate according to claim 1, wherein the center connection line is not parallel to the first direction.

5. The display substrate according to claim 1, wherein, in each of the plurality of pixel groups, a connection line between the center of the second sub-pixel and a center of the third sub-pixel is a first line segment; the first sub-pixel and the fourth sub-pixel are between the second sub-pixel and the third sub-pixel, and are respectively on two sides of the first line segment; a connection line between the center of the first sub-pixel and a center of the fourth sub-pixel is a second line segment; a length of the second line segment is smaller than a length of the first line segment.

6. The display substrate according to claim 5, wherein the first line segment extends in the first direction and the second line segment extends in a second direction;
the plurality of pixel groups are arranged in an array to form a plurality of rows and a plurality of columns, and pixel groups of even rows and pixel groups of odd rows are arranged in a staggered way;
a length of a center connection line between the second sub-pixel and third sub-pixel which are adjacent to each other in two adjacent ones of the plurality of pixel groups in the first direction is less than the length of the first line segment;
in two adjacent ones of the odd rows or in two adjacent ones of the even rows, a length of a center connection line between the first sub-pixel and fourth sub-pixel which are adjacent to each other in two adjacent ones of the plurality of pixel groups in the second direction is greater than the length of the second line segment,
an extension line of the second line segment of each pixel group passes through a midpoint of a center connection line between two pixel groups which are adjacent to the pixel group in the second direction and are in the same row.

7. The display substrate according to claim 1, wherein the first spacer is between the first sub-pixel and the second sub-pixel which belong to two adjacent ones of the plurality of pixel groups, and/or between the first sub-pixel and the fourth sub-pixel which belong to two adjacent ones of the plurality of pixel groups.

8. The display substrate according to claim 1, wherein the first spacer and the second spacer around the second sub-pixel or the fourth sub-pixel form a spacer pair, and the first spacer and the second spacer in the spacer pair are on the same side of the second sub-pixel or the third sub-pixel.

9. The display substrate according to claim 1, wherein, in the same one of the plurality of pixel groups, no spacer is among the first sub-pixel, the second sub-pixel, the third sub-pixel and the fourth sub-pixel.

10. The display substrate according to claim 1, wherein at least one selected from the group consisting of the first sub-pixel and the fourth sub-pixel is a sub-pixel with a human eye sensitive color.

11. The display substrate according to claim 1, wherein, in the first direction, widths of the first sub-pixel, the second sub-pixel, the third sub-pixel and the fourth sub-pixel are the same.

12. A display device, comprising the display substrate according to claim 1.

13. A display substrate, comprising: a first sub-pixel, a second sub-pixel and a first spacer;
wherein a connection line between a center of the first sub-pixel and a center of the second sub-pixel is a center connection line, the center connection line is not perpendicular to a first direction, and the first direction is at least one selected from the group consisting of a row direction and a column direction;
the first spacer is between the first sub-pixel and the second sub-pixel, and an extension direction of the first spacer between the first sub-pixel and the second sub-pixel is not perpendicular to the first direction,
wherein the display substrate comprises a plurality of pixel groups, each of the plurality of pixel groups comprises one first sub-pixel, one second sub-pixel, one third sub-pixel and one fourth sub-pixel; and the first spacer is between the first sub-pixel and the second sub-pixel which belong to different ones of the plurality of pixel groups,
wherein, in each of the plurality of pixel groups, a connection line between the center of the second sub-pixel and a center of the third sub-pixel is a first line segment; the first sub-pixel and the fourth sub-pixel are between the second sub-pixel and the third sub-pixel, and are respectively on two sides of the first line segment; a connection line between the center of the first sub-pixel and a center of the fourth sub-pixel is a second line segment; a length of the second line segment is smaller than a length of the first line segment,
a ratio of the length of the second line segment to the length of the first line segment is less than or equal to 3/4, and
the display substrate further comprises: a second spacer, wherein the second spacer is between two adjacent ones of the plurality of pixel groups, and the second spacer is between the fourth sub-pixel and the second sub-pixel which belong to different ones of the plurality of pixel groups, or between the fourth sub-pixel and the third sub-pixel which belong to different ones of the plurality of pixel groups; an extension direction of the second spacer between the fourth sub-pixel and the second sub-pixel or between the fourth sub-pixel and the third sub-pixel is not perpendicular to the first direction.

14. The display substrate according to claim 13, wherein at least one selected from the group consisting of the first spacer and the second spacer does not overlap with a center connection line between the first sub-pixel and the third sub-pixel.

15. The display substrate according to claim 13, wherein the first line segment extends in the first direction and the second line segment extends in the second direction, and an orthographic projection of the first spacer on a straight line in the first direction does not overlap or partially overlap with an orthographic projection of at least one selected from the group consisting of the second sub-pixel and the third sub-pixel on the straight line in the first direction.

16. The display substrate according to claim 13, wherein a ratio of a sum of numbers of the first spacer and the second spacer to a number of sub-pixels is 0.3-1, and the sub-pixels comprise the first sub-pixel, the second sub-pixel, the third sub-pixel and the fourth sub-pixel.

17. The display substrate according to claim 13, wherein the first spacer and the second spacer are both transparent spacers.

18. A display substrate, comprising:
a pixel arrangement structure comprising a plurality of pixel groups; each of the plurality of pixel groups comprises a first sub-pixel, a second sub-pixel, a third sub-pixel and a fourth sub-pixel; in each of the plurality of pixel groups, a connection line between a center of the second sub-pixel and a center of the third sub-pixel is a first line segment; the first sub-pixel and the fourth sub-pixel are between the second sub-pixel and the third sub-pixel and are respectively at two sides of the first line segment; a connection line between a center of the first sub-pixel and the center of the fourth sub-pixel is a second line segment; a length of the second line segment is less than a length of the first line segment; the display substrate further comprises:
a first spacer between the first sub-pixel and the second sub-pixel which are adjacent to each other in two adjacent ones of the plurality of pixel groups; and
a second spacer between the fourth sub-pixel and the second sub-pixel which are adjacent to each other in two adjacent ones of the plurality of pixel groups;
wherein the second spacer is between two adjacent ones of the plurality of pixel groups, and the second spacer is between the fourth sub-pixel and the second sub-pixel which belong to different ones of the plurality of pixel groups, or between the fourth sub-pixel and the third sub-pixel which belong to different ones of the plurality of pixel groups; an extension direction of the second spacer between the fourth sub-pixel and the second sub-pixel or between the fourth sub-pixel and the third sub-pixel is not perpendicular to the first direction.

* * * * *